(12) United States Patent
Ishihara et al.

(10) Patent No.: US 10,674,604 B2
(45) Date of Patent: *Jun. 2, 2020

(54) PRINTED WIRING BOARD AND METHOD FOR MANUFACTURING THE SAME

(71) Applicant: IBIDEN CO., LTD., Ogaki (JP)

(72) Inventors: Teruyuki Ishihara, Ogaki (JP); Hiroyuki Ban, Ogaki (JP); Haiying Mei, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 406 days.

This patent is subject to a terminal disclaimer.

(21) Appl. No.: 15/339,057

(22) Filed: Oct. 31, 2016

(65) Prior Publication Data

US 2017/0127517 A1 May 4, 2017

(30) Foreign Application Priority Data

Oct. 29, 2015 (JP) .................................. 2015-212829

(51) Int. Cl.
*H05K 1/11* (2006.01)
*H05K 1/18* (2006.01)
(Continued)

(52) U.S. Cl.
CPC ............ *H05K 1/111* (2013.01); *H01L 21/486* (2013.01); *H01L 23/49822* (2013.01); *H01L 23/49827* (2013.01); *H01L 23/5389* (2013.01); *H05K 1/056* (2013.01); *H05K 1/115* (2013.01); *H05K 1/181* (2013.01); *H05K 3/06* (2013.01);
(Continued)

(58) Field of Classification Search
CPC ...... H05K 1/111; H05K 1/056; H05K 3/4007; H05K 3/4682; H05K 1/115; H05K 3/06; H05K 3/467; H05K 2201/10674; H05K 2201/0367; H05K 3/205; H05K 3/007; H05K 2203/072; H05K 2201/10954; H01L 23/5389; H01L 21/486; H01L 23/49827; H01L 23/49822; H01L 2221/68359; H01L 23/3121; H01L 2221/68345; H01L 21/6835; H01L 2224/16225

See application file for complete search history.

(56) References Cited

U.S. PATENT DOCUMENTS 9,236,334 B2 * 1/2016 Kaneko .................. H05K 3/244
10,256,175 B2 * 4/2019 Ishihara ............ H01L 23/49822
(Continued)

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a multilayer body, a first wiring layer formed on first surface of the body and including first pads, a second wiring layer embedded into second surface of the body and including second and third pads, conductor posts formed on the third pads, and via conductors formed in the body and having diameter reducing toward the second surface of the body. Each third pad has metal foil formed thereon such that each post is formed on the foil, the second wiring layer is formed such that the second pads are positioned to connect an electronic component in central portion of the second surface of the body and the third pads are positioned to connect another board in outer edge portion of the second surface of the body, and the second pads are formed such that each second pad has exposed surface recessed from the second surface.

20 Claims, 22 Drawing Sheets

(51) Int. Cl.
  *H05K 3/06* (2006.01)
  *H05K 3/46* (2006.01)
  *H01L 23/498* (2006.01)
  *H01L 21/48* (2006.01)
  *H01L 23/538* (2006.01)
  *H05K 1/05* (2006.01)
  *H05K 3/40* (2006.01)
  *H05K 3/00* (2006.01)
  *H05K 3/20* (2006.01)
  *H01L 21/683* (2006.01)
  *H01L 23/31* (2006.01)

(52) U.S. Cl.
  CPC ......... *H05K 3/4007* (2013.01); *H05K 3/467* (2013.01); *H05K 3/4682* (2013.01); *H01L 21/6835* (2013.01); *H01L 23/3121* (2013.01); *H01L 2221/68345* (2013.01); *H01L 2221/68359* (2013.01); *H01L 2224/16225* (2013.01); *H05K 3/007* (2013.01); *H05K 3/205* (2013.01); *H05K 2201/0367* (2013.01); *H05K 2201/10674* (2013.01); *H05K 2201/10954* (2013.01); *H05K 2203/072* (2013.01)

(56) References Cited

U.S. PATENT DOCUMENTS

| | | | |
|---|---|---|---|
| 2009/0242245 A1* | 10/2009 | Asano | H01L 21/6835 174/255 |
| 2010/0139964 A1* | 6/2010 | An | H01L 21/4857 174/261 |
| 2010/0147560 A1* | 6/2010 | Kaneko | H01L 23/13 174/250 |
| 2010/0289134 A1 | 11/2010 | Chow et al. | |
| 2011/0291249 A1* | 12/2011 | Chi | H01L 21/4832 257/675 |
| 2012/0234589 A1* | 9/2012 | Furuichi | H05K 3/4682 174/261 |

* cited by examiner

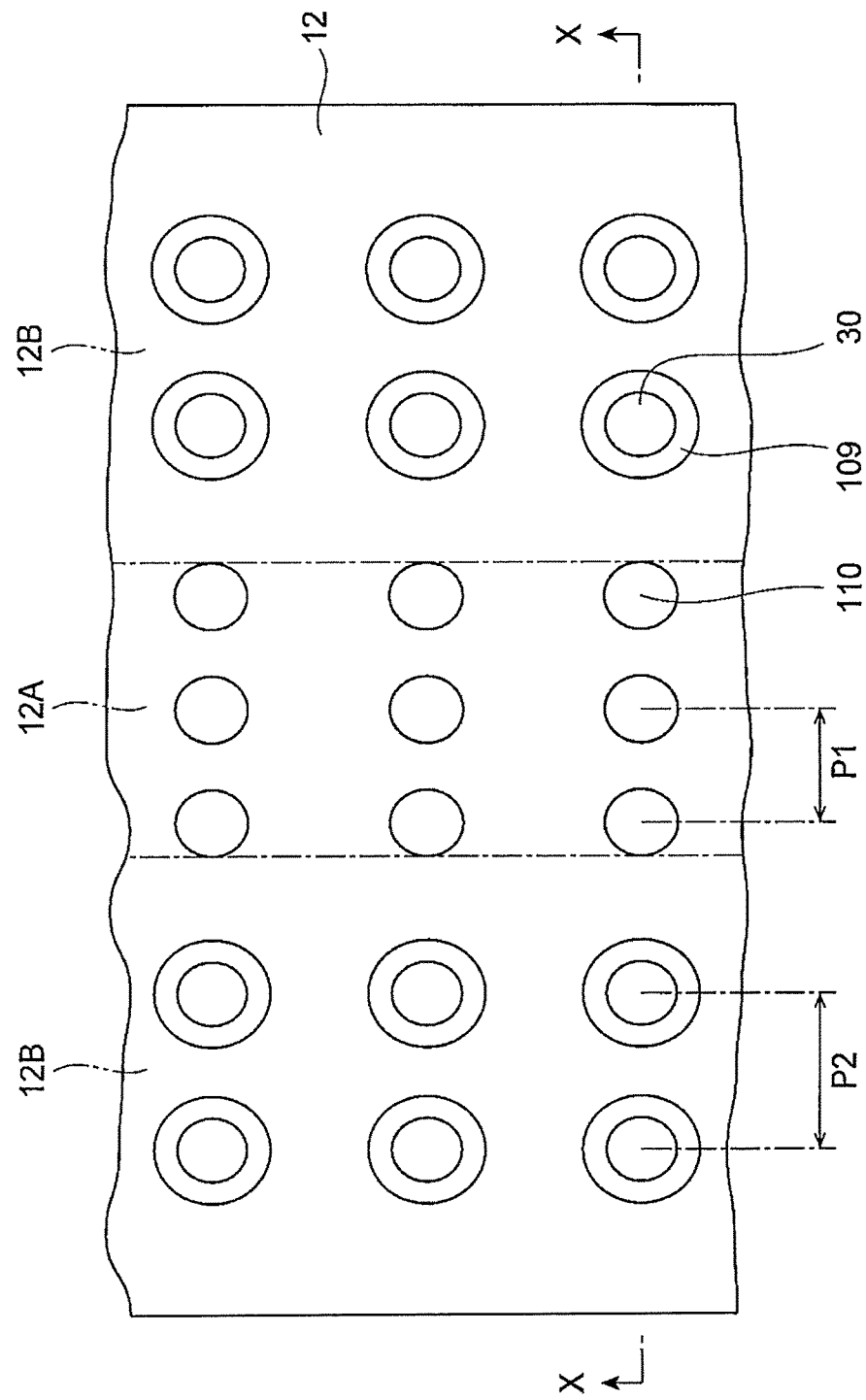

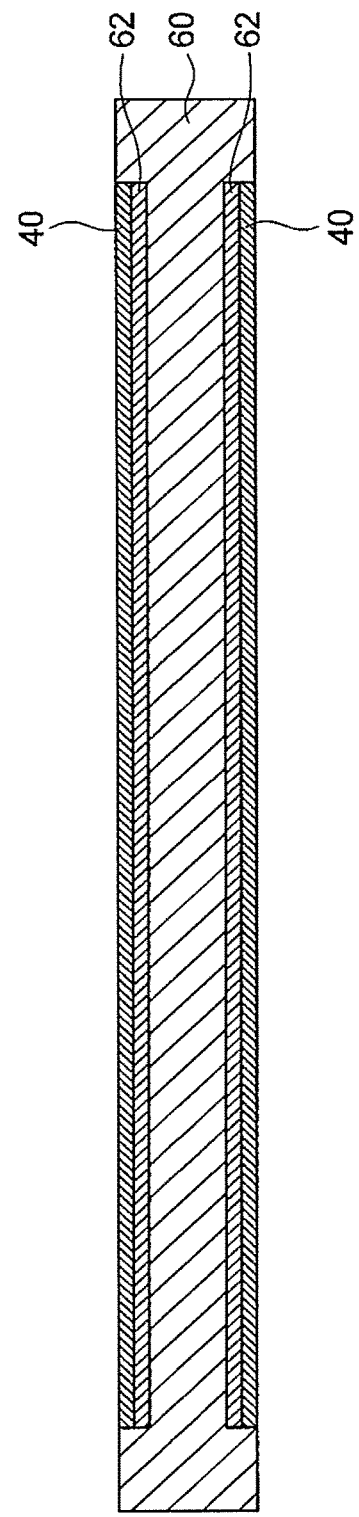

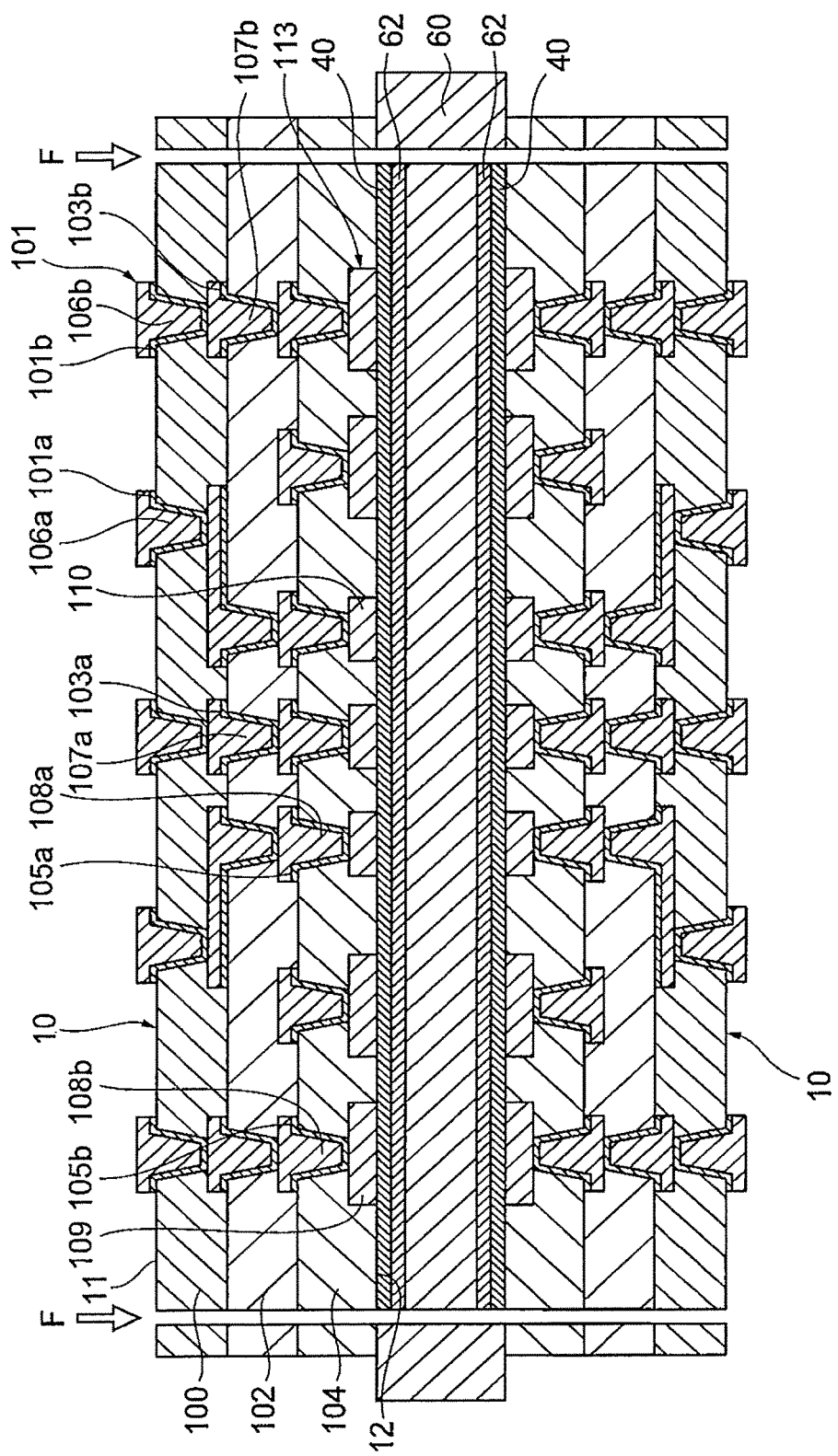

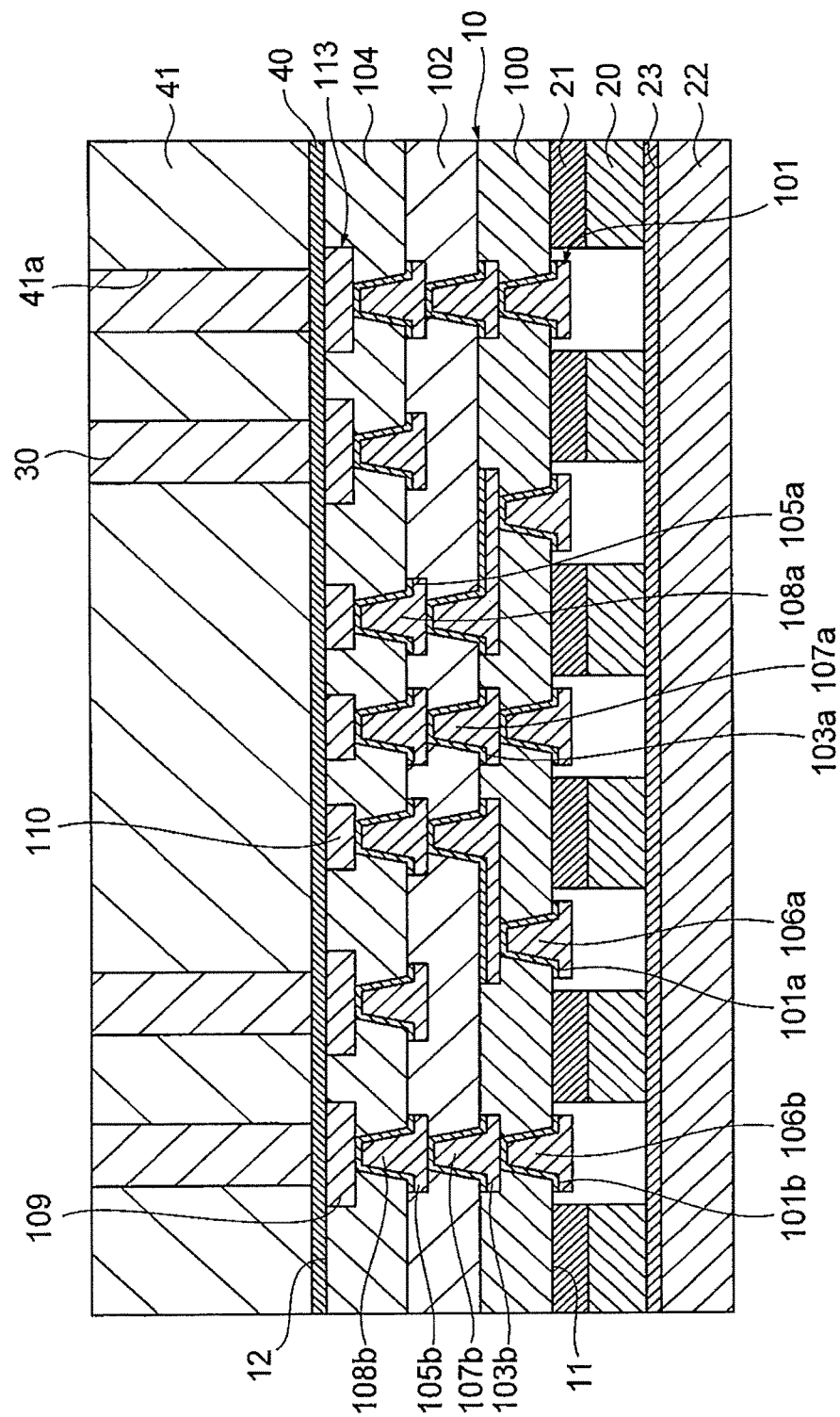

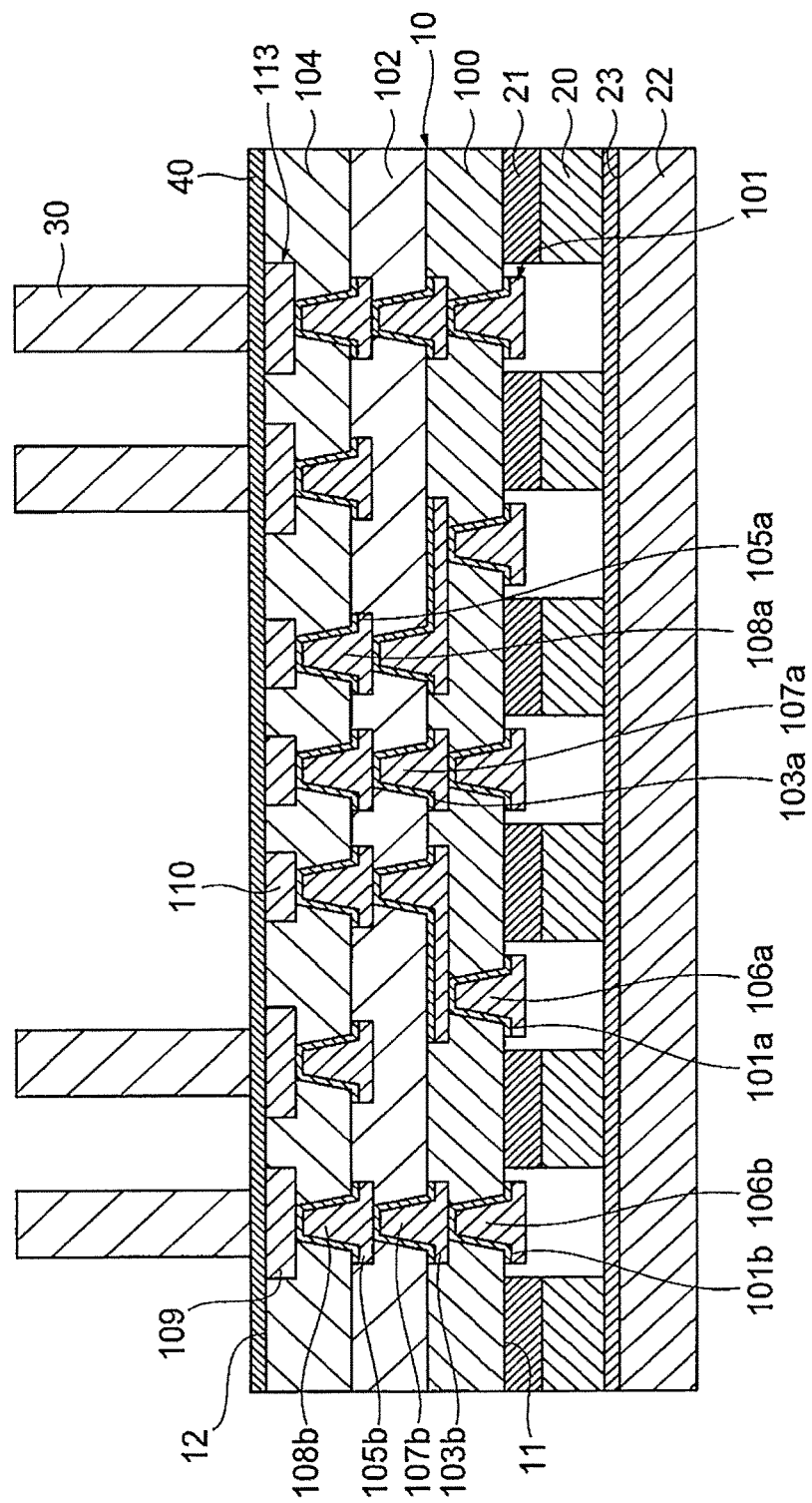

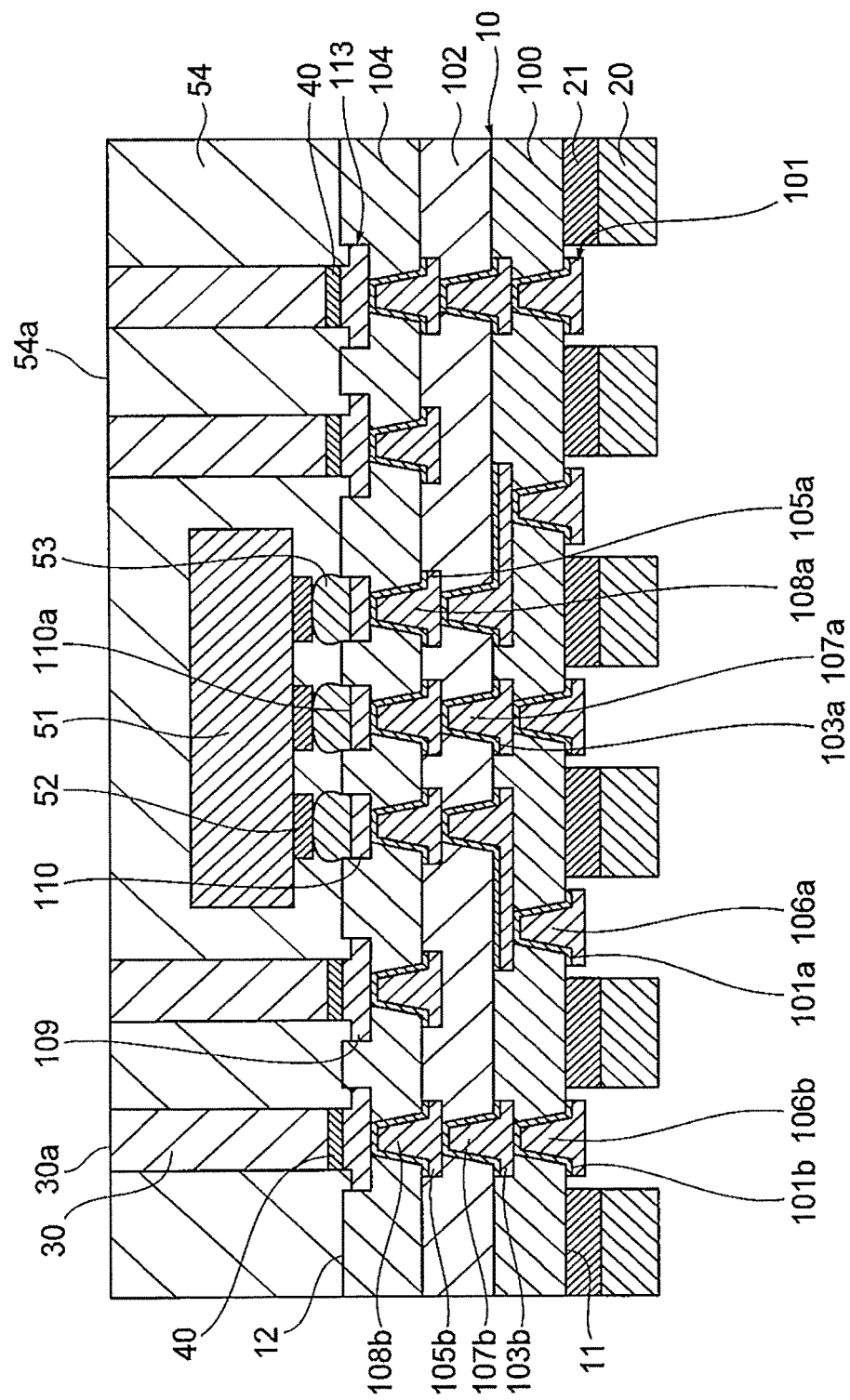

PRINTED WIRING BOARD AND METHOD FOR MANUFACTURING THE SAME

CROSS-REFERENCE TO RELATED APPLICATIONS

The present application is based upon and claims the benefit of priority to Japanese Patent Application No. 2015-212829, filed Oct. 29, 2015, the entire contents of which are incorporated herein by reference.

BACKGROUND OF THE INVENTION

Field of the Invention

The present invention relates to a printed wiring board for package-on-package (POP) and a method for manufacturing the printed wiring board.

Description of Background Art

U.S. Patent Application Publication No 2010/0289134 A1 describes a method in which a lower substrate and an upper substrate are electrically connected via solder balls (that is, solder bumps) formed on conductor pads of the lower substrate. The entire contents of this publication are incorporated herein by reference.

SUMMARY OF THE INVENTION

According to one aspect of the present invention, a printed wiring board includes a multilayer body, a first wiring layer formed on a first main surface of the multilayer body and including first conductor pads, a second wiring layer embedded into a second main surface of the multilayer body on the opposite side with respect to the first surface and including second conductor pads and third conductor pads, conductor posts each including a plating material and formed on the third conductor pads, respectively, and via conductors formed in the multilayer body such that each of the via conductors has a diameter gradually reducing from the first main surface toward the second main surface of the multiple body. Each of the third conductor pads has a metal foil formed thereon such that each of the conductor posts is formed on the metal foil, the second wiring layer is formed such that the second conductor pads are positioned to connect an electronic component and formed in a central portion of the second main surface of the multilayer body and that the third conductor pads are positioned to connect another wiring board and formed in an outer edge portion of the second main surface of the multilayer body, and the second conductor pads are formed such that each of the second conductor pads has an exposed upper surface recessed from the second main surface.

According to another aspect of the present invention, a method for manufacturing a printed wiring board includes fixing a metal foil having a carrier copper foil to a first base plate, forming a second wiring layer including second conductor pads and third conductor pads, forming a multilayer body on the second wiring layer and on the metal foil such that the multilayer body has a first main surface and a second main surface facing the metal foil on the opposite side with respect to the first main surface, forming a first wiring layer including first conductor pads on the first main surface of the multilayer body, removing the first base plate and the carrier copper foil from the metal foil such that the metal foil is exposed, fixing, to the first main surface of the multilayer body, a second base plate having a bonding layer and opening portions such that the bonding layer attaches the second base plate to the first main surface of the multilayer body and the opening portions expose the first conductor pads, respectively, forming conductor posts on the metal foil such that the conductor posts are positioned on the third conductor pads, respectively, and removing part of the metal foil not in contact with the conductor posts. The second wiring layer is formed such that the second conductor pads are positioned to connect an electronic component and formed in a central portion of the metal foil and that the third conductor pads are positioned to connect another wiring board and formed in an outer edge portion of the metal foil.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a partial plan view illustrating positions of the second conductor pads and third conductor pads;

FIG. 4A-4F are process diagrams describing a method for manufacturing the printed wiring board;

FIG. 5A-5F are process diagrams describing the method for manufacturing the printed wiring board;

FIG. 5H is a schematic cross-sectional view for describing forming a sealing resin layer on the printed wiring board;

DETAILED DESCRIPTION OF THE EMBODIMENTS

Figure 1:
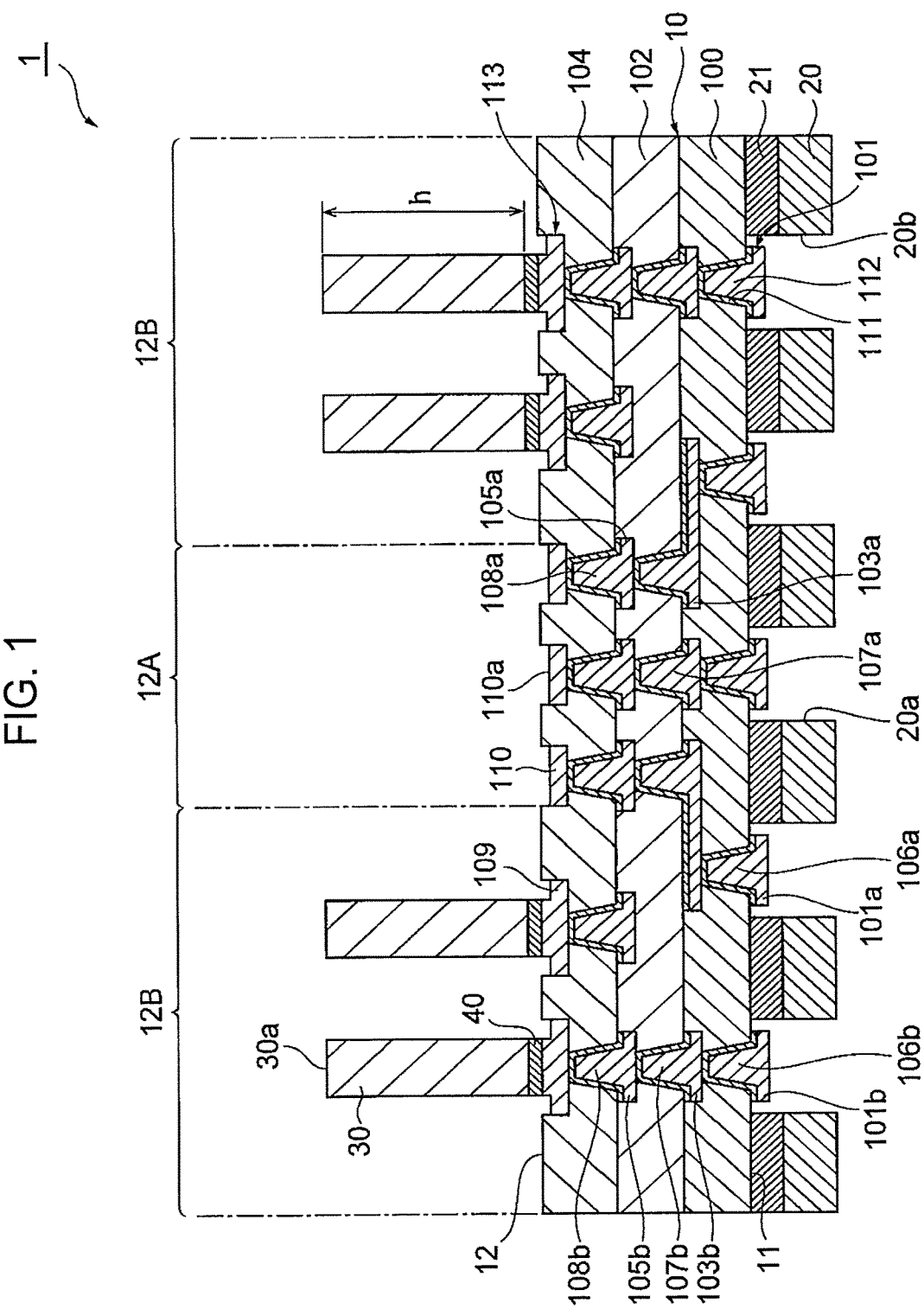
FIG. 1 is a schematic cross-sectional view illustrating a printed wiring board according to a first embodiment.

The embodiments will now be described with reference to the accompanying drawings, wherein like reference numerals designate corresponding or identical elements throughout the various drawings.

First Embodiment

FIG. 1 is a schematic cross-sectional view illustrating a printed wiring board according to a first embodiment. A printed wiring board 1 according to the present embodiment includes a multilayer body 10 that has a first main surface 11 and a second main surface 12 that is on an opposite side of the first main surface 11, a base plate 20 that is affixed to the first main surface 11 of the multilayer body 10, and multiple conductor posts 30 that are erected on the second main surface 12 side.

The multilayer body 10 is a build-up structure in which multiple wiring layers and multiple insulating layers are alternately laminated. Specifically, the multilayer body 10 includes, in an order from the first main surface 11 toward the second main surface 12 side, an insulating layer 100, an insulating layer 102 and an insulating layer 104. That is, among these insulating layers, the insulating layer 100 is formed on a lowermost side, the insulating layer 104 is formed on an uppermost side, and the insulating layer 102 is formed between the insulating layer 100 and the insulating layer 104. Therefore, a lower surface of the insulating layer 100 forms the first main surface 11 of the multilayer body 10, and an upper surface of the insulating layer 104 forms the second main surface 12 of the multilayer body 10. The insulating layers (100, 102, 104), for example, are each formed of an interlayer resin film.

A wiring layer 101 that includes multiple first conductor pads (101a) and multiple first conductor pads (101b) is formed on the first main surface 11 of the multilayer body 10. The wiring layer 101 corresponds to a "first wiring layer" and is formed, for example, by an electroless plating layer 111 and an electrolytic plating layer 112. A wiring layer in the present embodiment refers to a conductor layer that forms an electrical circuit, and may include pads and wirings or the like or may include only pads, depending on a position of the wiring layer. FIG. 1 illustrates a case where only pads are included.

The first conductor pads (101a) are formed in a central portion of the first main surface 11, and are structures for electrically connecting to second conductor pads 110 (to be described later). On the other hand, the first conductor pads (101b) are formed in an outer edge portion of the first main surface 11, and are structures for electrically connecting to third conductor pads 109 (to be described later). In the present embodiment, the first conductor pads (101a) and the first conductor pads (101b) have the same pitch and the same area. However, the present invention is not limited to this. For example, when necessary, it is also possible that the pitch and the area of the first conductor pads (101b) formed in the outer edge portion are larger than those of the first conductor pads (101a) formed in the central portion, or vice versa.

A wiring layer (103a) and a wiring layer (103b) are formed on a lower surface of the insulating layer 102. The wiring layer (103a) is a structure for electrically connecting to the second conductor pads 110, and is formed above the first conductor pads (101a). The wiring layer (103a) is electrically connected to the first conductor pads (101a) via via conductors (106a) that are formed inside the insulating layer 100. On the other hand, the wiring layer (103b) is a structure for electrically connecting to the third conductor pads 109, and is formed above the first conductor pads (101b). The wiring layer (103b) is electrically connected to the first conductor pads (101b) via via conductors (106b) that are formed inside the insulating layer 100.

Further, a wiring layer (105a) and a wiring layer (105b) are formed on a lower surface of the insulating layer 104. The wiring layer (105a) is a structure for electrically connecting to the second conductor pads 110, and is formed above the wiring layer (103a). The wiring layer (105a) is electrically connected to the wiring layer (103a) via via conductors (107a) that are formed inside the insulating layer 102. On the other hand, the wiring layer (105b) is a structure for electrically connecting to the third conductor pads 109, and is formed above the wiring layer (103b). As illustrated in FIG. 1, a portion of the wiring layer (105b) is electrically connected to the wiring layer (103b) via via conductors (107b) that are formed inside the insulating layer 102. However, the other portion of the wiring layer (105b) is not electrically connected to the wiring layer (103b). Similar to the wiring layer 101, the wiring layers (103a, 103b, 105a, 105b) are each formed by an electroless plating layer 111 and an electrolytic plating layer 112.

Figure 2:
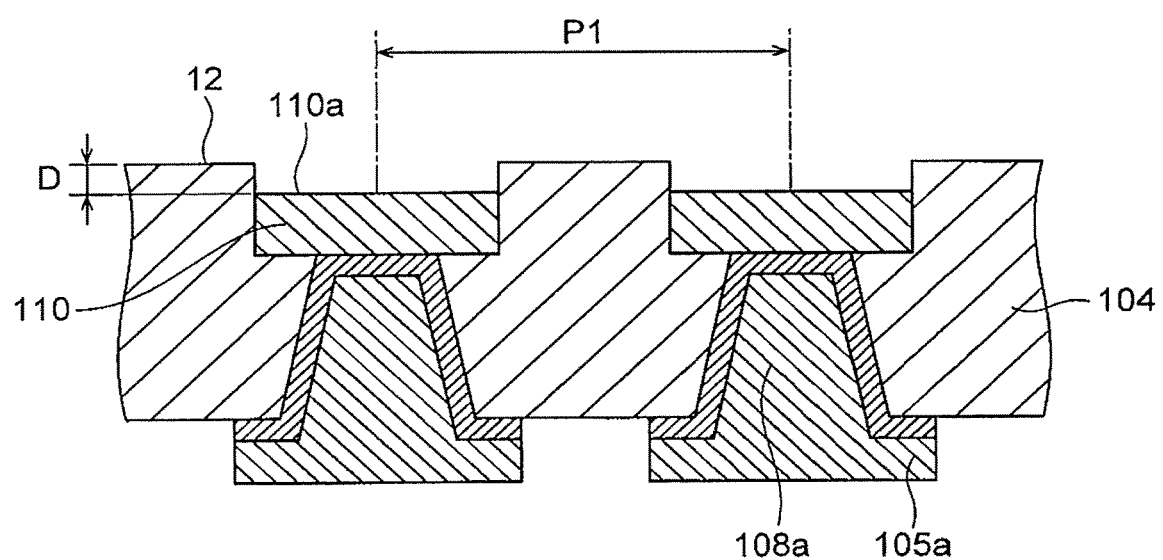
FIG. 2 is an enlarged cross-sectional view of second conductor pads illustrated in FIG. 1.

A wiring layer 113 that includes the multiple second conductor pads 110 and the multiple third conductor pads 109 is formed on the second main surface 12 side of the multilayer body 10. The wiring layer 113 corresponds to a "second wiring layer" and is formed, for example, by a copper plating layer. The second conductor pads 110 are positioned in a central portion (12A) of the second main surface 12, and are embedded in the insulating layer 104. An upper surface (110a) of each of the second conductor pads 110 is recessed from the second main surface 12. FIG. 2 is an enlarged cross-sectional view of the second conductor pads illustrated in FIG. 1. As illustrated in FIG. 2, when a recess amount of the upper surface (110a) of each of the second conductor pads 110 from the second main surface 12 (that is, a distance from the upper surface (110a) to the second main surface 12) is D, it is preferable that $0 < D < 10$ µm. In this way, even for the second conductor pads 110 formed at a fine pitch, when solder bumps are formed, occurrence of a short circuit between the solder bumps can be suppressed and mounting reliability can be improved.

On the other hand, the third conductor pads 109 are positioned in an outer edge portion (12B) of the second main surface 12 so as to sandwich the second conductor pads 110 from left and right sides. The third conductor pads 109 are embedded in the insulating layer 104 and formed such that an upper surface of each of the third conductor pads 109 has a step. Further, a peripheral edge portion of the upper surface is recessed from the second main surface 12, similar to the upper surface (110a) of the second conductor pads 110.

FIG. 3 is a partial plan view illustrating positions of the second conductor pads and the third conductor pads. A cross-sectional view along an X-X line in FIG. 3 is FIG. 1. As illustrated in FIG. 3, the second conductor pads 110 are formed at a predetermined pitch (P1) in the central portion (12A) of the second main surface 12. The third conductor pads 109 are formed at a predetermined pitch (P2) in the outer edge portion (12B) of the second main surface 12. The pitch (P1) of the second conductor pads 110 is smaller than the pitch (P2) of the third conductor pads 109. The pitch (P2) of the third conductor pads 109 is the same as a pitch of the conductor posts 30. Here the term "pitch" refers to a distance between centers of adjacent pads or adjacent conductor posts.

The second conductor pads 110 are structures for connecting to an electronic component, and are electrically connected to the wiring layer (105a) via via conductors (108a) that are formed inside the insulating layer 104. The third conductor pads 109, together with copper foils 40 and the conductor posts 30, are structures for connecting to another wiring board. The third conductor pads 109 are electrically connected to the wiring layer (105b) via via conductors (108b) that are formed inside the insulating layer 104.

The via conductors (106a, 106b, 107a, 107b, 108a, 108b) are each formed in a truncated cone shape that is gradually reduced in diameter from the first main surface 11 toward the second main surface 12. Further, the via conductors (106a, 106b, 107a, 107b, 108a, 108b) are each formed from an electroless plating layer 111 and an electrolytic plating layer 112.

As illustrated in FIG. 1, of the via conductors (106a, 107a, 108a) that are electrically connected to the second conductor pads 110, some are linearly stacked along a lamination direction of the insulating layers (100, 102, 104) and form stacked structures, and others are stacked at shifted positions along the lamination direction and form offset structures. On the other hand, some of the via conductors (106b, 107b, 108b) that are electrically connected to the third conductor pads 109 are linearly stacked along the lamination direction and form stacked structures.

The copper foils 40 are respectively formed on the third conductor pads 109. The column-shaped conductor posts 30 are respectively erected on the copper foil 40. The conductor posts 30, for example, are each formed by a copper plating layer. When a height of each of the conductor posts 30 (that is, a distance from an upper surface of each of the copper foils 40 to a top surface (30a) of each of the conductor posts 30) is h, it is preferable that 50 µm<h<200 µm. Further, it is preferable that a diameter of each of the conductor posts 30 be smaller than a diameter of each of the third conductor pads 109 and be 80-150 µm.

The base plate 20 is formed of a material having a certain strength such as a metal plate or a prepreg material, and is affixed to the first main surface 11 of the multilayer body 10 via a bonding layer 21. Multiple openings (20a) for exposing the first conductor pads (101a) and multiple openings (20b) for exposing the first conductor pads (101b) are formed in the base plate 20 and the bonding layer 21.

In the printed wiring board 1 that is structured as described above, the conductor posts 30 are erected on the second main surface 12 side of the multilayer body 10. The printed wiring board 1 can be electrically connected to another wiring board via the conductor posts 30. The conductor posts 30 do not laterally expand during melting. Therefore, intervals between the conductor posts 30 can be reduced while an electrical short circuit between adjacent conductor posts 30 can be prevented. Therefore, formation of wirings at a fine pitch in the printed wiring board 1 can be easily achieved.

In addition, the upper surfaces (110a) of the second conductor pads 110 are exposed to the outside and are recessed from the second main surface 12 of the multilayer body 10. Therefore, the second main surface 12 can function as a solder resist layer and can protect the upper surfaces (110a) of the second conductor pads 110. Further, by allowing the upper surfaces (110a) to be recessed from the second main surface 12, a step is formed between each of the upper surfaces (110a) and the second main surface 12. When solder bumps are formed on the upper surfaces (110a) of the second conductor pads 110, the steps can restrict flow of the solder bumps to surrounding areas and can prevent occurrence of an electrical short circuit between adjacent solder bumps.

Further, the third conductor pads 109 and the copper foils 40 are respectively interposed between the conductor posts 30 and the via conductors (108b), and the diameter of the conductor posts 30 is smaller than the diameter of the third conductor pads 109. Therefore, a load of the conductor posts 30 is dispersed by the copper foils 40 and the third conductor pads 109. Therefore, a stress acting on the via conductors (108b) can be relaxed and thus, occurrence of a crack in the via conductors (108b) due to stress concentration can be suppressed and an effect of improving connection reliability can be expected.

Further, the base plate 20 is affixed to the first main surface 11 of the multilayer body 10 via the bonding layer 21. Therefore, the base plate 20 can increase strength of the printed wiring board 1 and can suppress occurrence of warpage. As a result, as compared to a printed wiring board having warpage, conduction inspection of the printed wiring board 1 can be easily performed and an effect of increasing accuracy of the conduction inspection can be achieved. Further, the openings (20a, 20b) for exposing the first conductor pads (101a, 101b) are formed in the base plate 20 and the bonding layer 21, Therefore, occurrence of warpage of the printed wiring board 1 can be prevented and the conduction inspection can be easily performed through the openings (20a, 20b).

When inspection of conduction between a conductor post 30 and a first conductor pad (101b) is performed, for example, one terminal of a meter for the conduction inspection is brought into contact with the top surface (30a) of the conductor posts 30 and the other terminal of the meter is brought into contact with the first conductor pad (101b) by inserting the other terminal into the opening (20b) that exposes the first conductor pad (101b), and a resistance value between the conductor post 30 and the first conductor pad (101b) is measured. On the other hand, when inspection of conduction between a second conductor pad 110 and a first conductor pad (101a) is performed, one terminal of the meter for the conduction inspection is brought into contact with the upper surface (110a) of the second conductor pad 110 and the other terminal of the meter is brought into contact with the first conductor pad (101a) by inserting the other terminal into the opening (20a) that exposes the first conductor pad (101a), and a resistance value between the second conductor pad 110 and the first conductor pad (101a) is measured.

Method for Manufacturing Printed Wiring Board

In the following, with reference to FIG. 4A-5H, a method for manufacturing the printed wiring board 1 is described. Each process described below is performed on both upper and lower sides of a first base plate 60, a second base plate 20 (that is, the above-described base plate 20) and a third base plate 22, In FIGS. 4E and 5A, reference numeral symbols are used only for an upper portion. However, reference numeral symbols for a lower portion are the same as those for the upper portion. In FIG. 5B-5F, for clarity of the drawings, only an upper side of the third base plate 22 is illustrated.

The first base plate 60 is prepared. The first base plate 60, for example, is formed from a glass-containing prepreg material. Next, a copper foil 40 with a carrier copper foil 62 is affixed to both sides of the first base plate 60 (see FIG. 4A). Although not illustrated in the drawings, a release layer is applied between the carrier copper foil 62 and the copper foil 40.

Figure 4B:
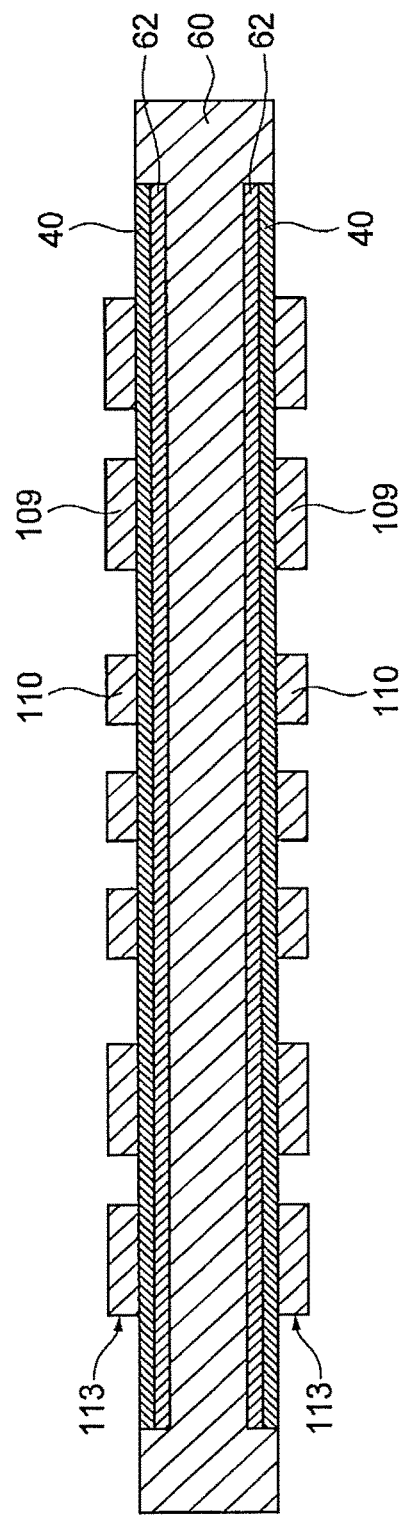
Figure 4C:
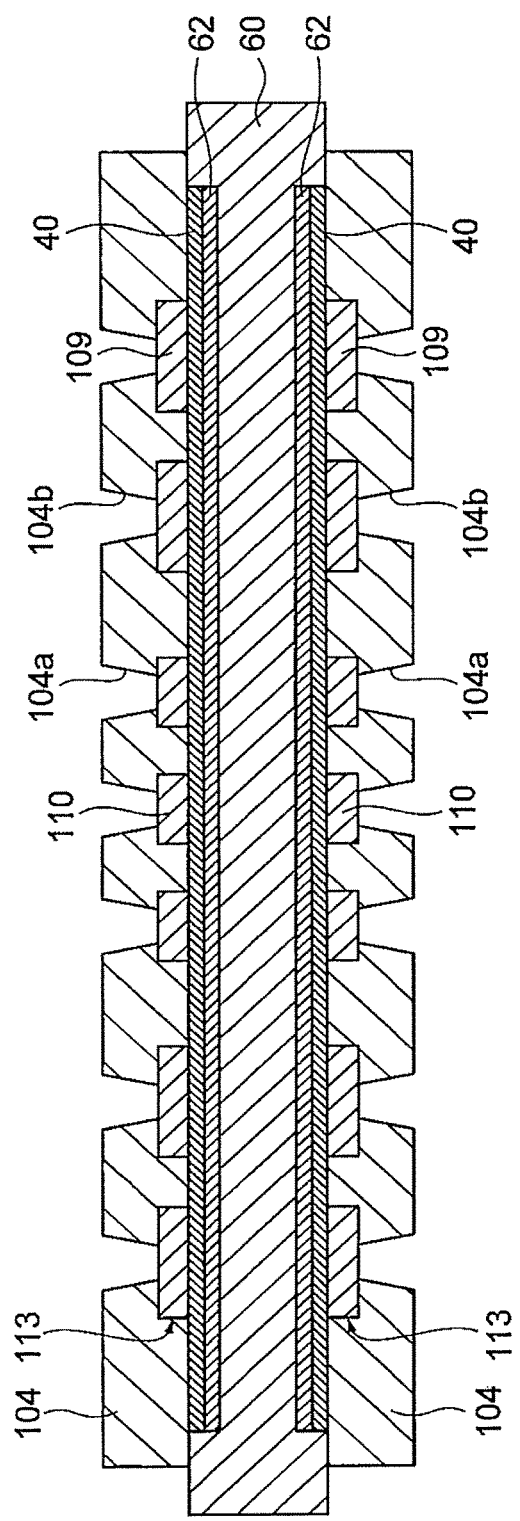
Figure 4D:
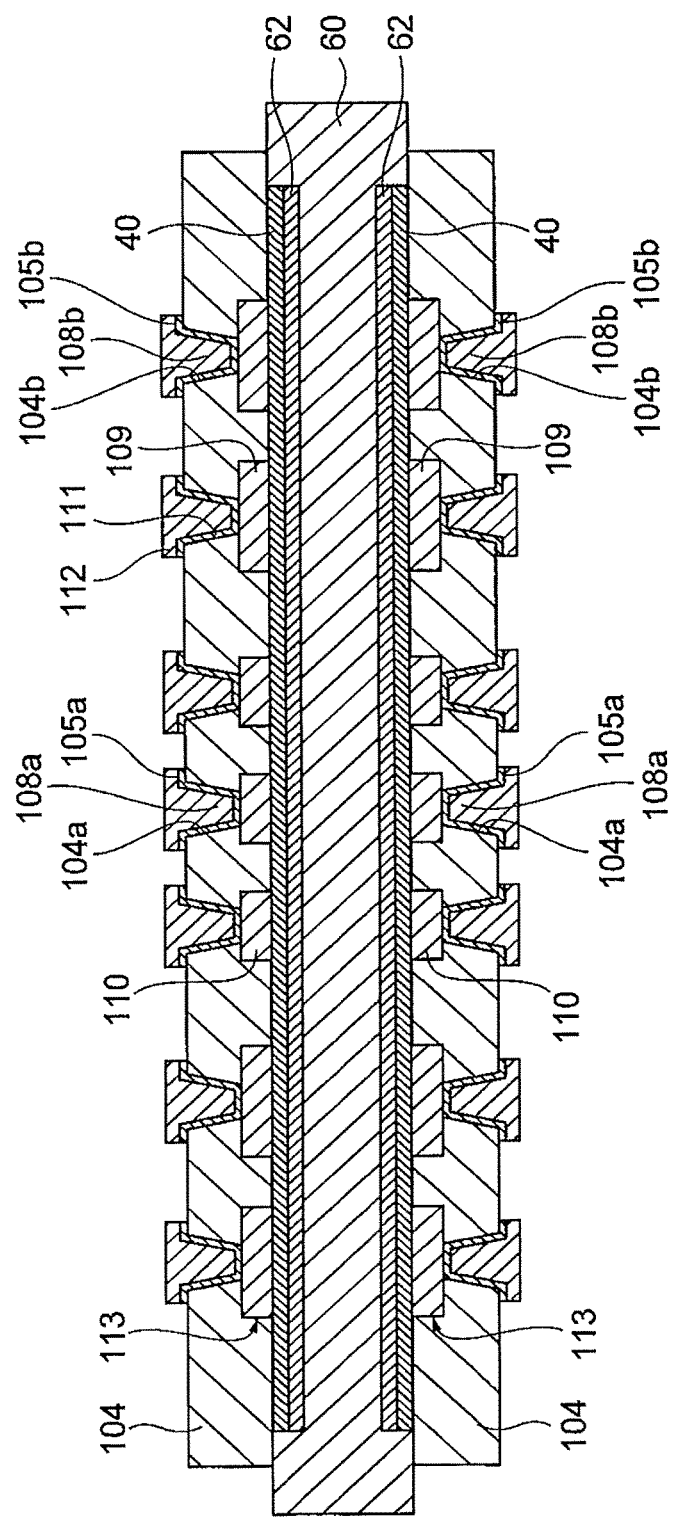
Figure 4F:
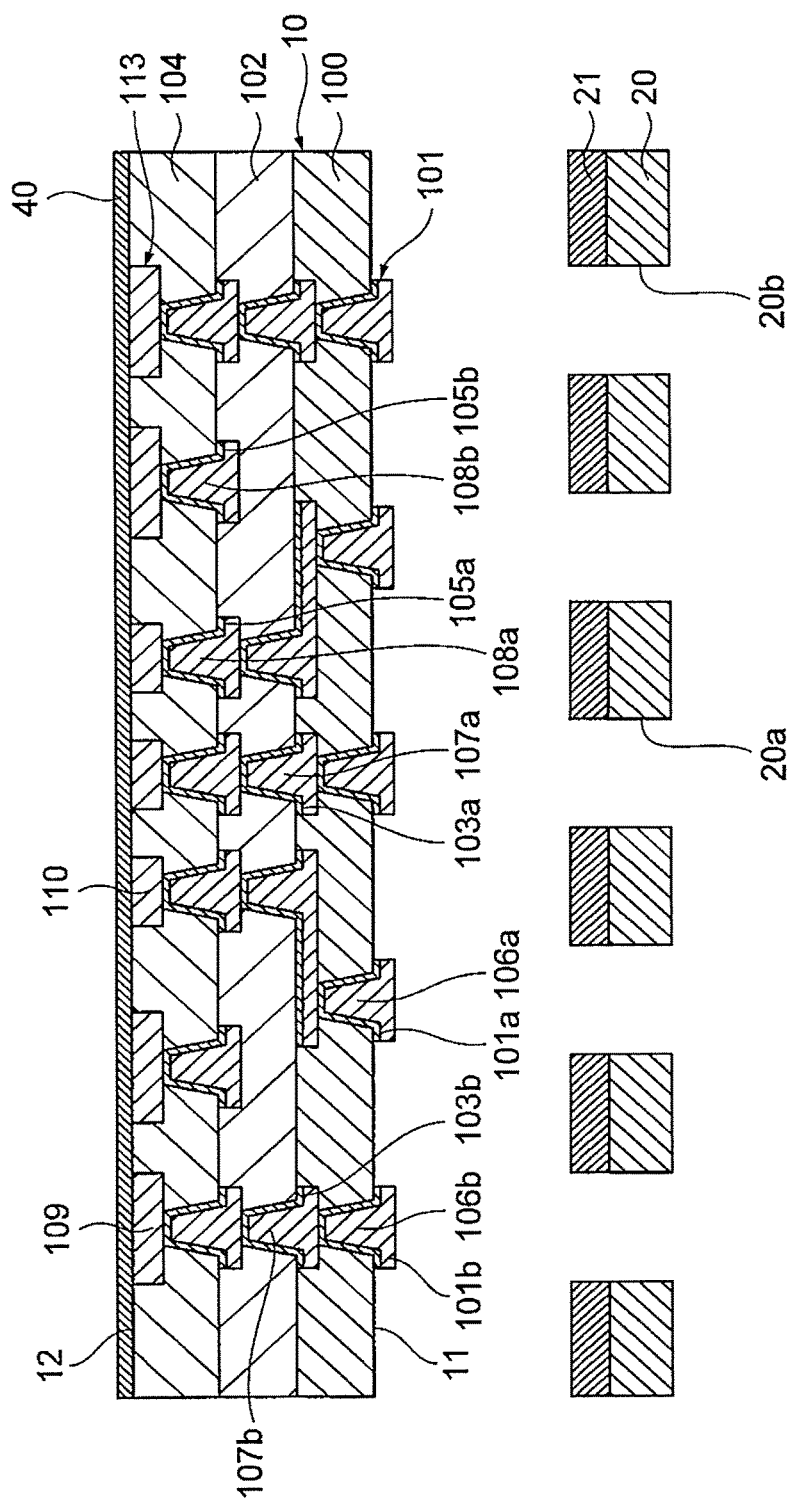

The wiring layer 113 that includes the multiple second conductor pads 110 and the multiple third conductor pads 109 is formed at predetermined locations of the copper foil 40 (see FIG. 4B). Specifically, first, a photosensitive resist layer is applied on the copper foil 40. Thereafter, by performing an exposure and development process, a resist pattern having multiple openings in a central portion and in an outer edge portion of the photosensitive resist layer is formed. Subsequently, by performing electrolytic copper plating using the copper foil 40 as a power feeding layer, the second conductor pads 110 are formed in the openings of the central portion and the third conductor pads 109 are formed in the openings of the outer edge portion. Thereafter, the resist pattern is removed, for example, using a solution containing monoethanolamine. As a result, only the wiring layer 113 that includes the second conductor pads 110 and the third conductor pads 109 remains on the copper foil 40.

The insulating layer 104 is laminated on the wiring layer 113 and on the copper foil 40 by laminating an interlayer resin film (product of ABF series manufactured by Ajinomoto Fine-Techno Co., Ltd) using a vacuum pressure-bonding method while increasing temperature. Subsequently, multiple via holes (104a) that expose the second conductor pads 110 and multiple via holes (104b) that expose the third conductor pads 109 are formed in the insulating layer 104 by laser irradiation. the formed via holes (104a, 104b) each have a truncated cone shape of which a diameter gradually increases along a direction away from the first base plate 60 (see FIG. 4C).

Using a semi-additive method (Semi Additive Process: SAP), the via conductors (108a, 108b) are formed in the via holes (104a, 104b) and the wiring layers (105a, 105b) are formed on the insulating layer 104 (see FIG. 4D). Specifically, first, by applying a catalyst such as palladium to an upper surface of the insulating layer 104 and to inner wall surfaces and bottom surfaces of the via holes (104a, 104b) and immersing the surfaces in an electroless plating solution for 5-60 minutes, an electroless plating layer 111 having a thickness in a range of 0.1-5 μm is formed. Subsequently, a photosensitive resist layer is laminated on the electroless plating layer 111 and a resist pattern is formed by an exposure and development process.

By performing electrolytic plating using the electroless plating layer 111 as a power feeding layer, an electrolytic plating layer 112 is formed. Thereafter, the resist pattern is removed. Further, the electroless plating layer 111 that is exposed by the removal of the resist pattern is removed by an etching process. Then, the electroless plating layer 111 and the electrolytic plating layer 112 that remain on the upper surface of the insulating layer 104 form the wiring layers (105a, 105b). On the other hand, the electroless plating layer 111 and the electrolytic plating layer 112 that are filled inside the via holes (104a, 104b) form the via conductors (108a, 108b).

By repeating the above-described method, the multilayer body 10 is formed. In this case, a lower surface of the insulating layer 104 forms the second main surface 12 of the multilayer body 10, and an upper surface of the insulating layer 100 forms the first main surface 11 of the multilayer body 10. Among the first main surface 11 and the second main surface 12, the second main surface 12 faces the copper foil 40 side (that is, is closest to the copper foil 40).

Subsequently, using the above-described method, the via conductors (106a, 106b) are formed in the insulating layer 100, and the wiring layer 101 that includes the multiple first conductor pads (101a, 101b) is formed on the upper surface of the insulating layer 100 (that is, on the first main surface 11 of the multilayer body 10) (see FIG. 4E).

By cutting an outer periphery of the multilayer body 10 formed on the first base plate 60 along arrows (F) in FIG. 4E, the first base plate 60 and the carrier copper foil 62 are peeled off. By peeling off the first base plate 60 and the carrier copper foil 62, the copper foil 40 is exposed.

The second base plate 20, on which the bonding layer 21 is formed, is prepared. For example, a material having a certain strength such as a metal plate or a prepreg material is used for the second base plate 20. Subsequently, the openings (20a, 20b) are formed in advance in the second base plate 20 and the bonding layer 21 such that, in a state in which the second base plate 20 is affixed to the first main surface 11 of the multilayer body 10, the first conductor pads (101a, 101b) that are formed on the first main surface 11 are exposed (see FIG. 4F). The second base plate 20 and the bonding layer 21 illustrated in FIG. 4F appear to be segmentalized by the openings (20a, 20b), but are actually in a state of being connected. Further, opening sizes of the openings (20a, 20b) can be adjusted according to sizes of the first conductor pads (101a, 101b).

The second base plate 20 is affixed to the first main surface 11 of the multilayer body 10 via the bonding layer 21. Then, in the state in which the second base plate 20 is affixed to the first main surface 11, the first conductor pads (101a) are exposed from the openings (20a) that are formed in the second base plate 20 and the bonding layer 21 and, on the other hand, the first conductor pads (101b) are exposed from the openings (20b).

Subsequently, the third base plate 22, on both sides of which a bonding layer 23 is formed, is prepared. Similar to the second base plate 20, a material having a certain strength such as a metal plate or a prepreg material is used for the third base plate 22. Next, the second base plate 20 in the state of being affixed to the first main surface 11 of the multilayer body 10 is fixed to the third base plate 22 via the bonding layer 23. In this case, the copper foil 40 is positioned on a side farthest from the third base plate 22 (see FIG. 5A).

The conductor posts 30 are formed on the copper foil 40 at positions in contact with the third conductor pads 109. Specifically, first, a photosensitive resist layer 41 is applied on the copper foil 40. Thereafter, openings (41a) are formed in the photosensitive resist layer 41 at positions in contact with the third conductor pads 109 by an exposure and development process (see FIG. 5B). In this case, a diameter of each of the formed openings (41a) is smaller than the diameter of each of the third conductor pads 109. Subsequently, by performing electrolytic copper plating using the copper foil 40 as a power feeding layer, the conductor posts 30 are formed in the openings (41a). Thereafter, by polishing the conductor posts 30, the height of the conductor posts 30 is adjusted (see FIG. 5C).

The remaining photosensitive resist layer 41 is removed, for example, using a solution containing monoethanolamine (see FIG. 5D). Thereafter, an exposed portion of the copper foil 40, other than a portion that is in contact with the conductor posts 30, is removed by selective etching (see FIG. 5E). Here, the portion that is in contact with the conductor posts 30 is a portion of the copper foil 40 that overlaps with the conductor posts 30 in a plan view.

Figure 5A:
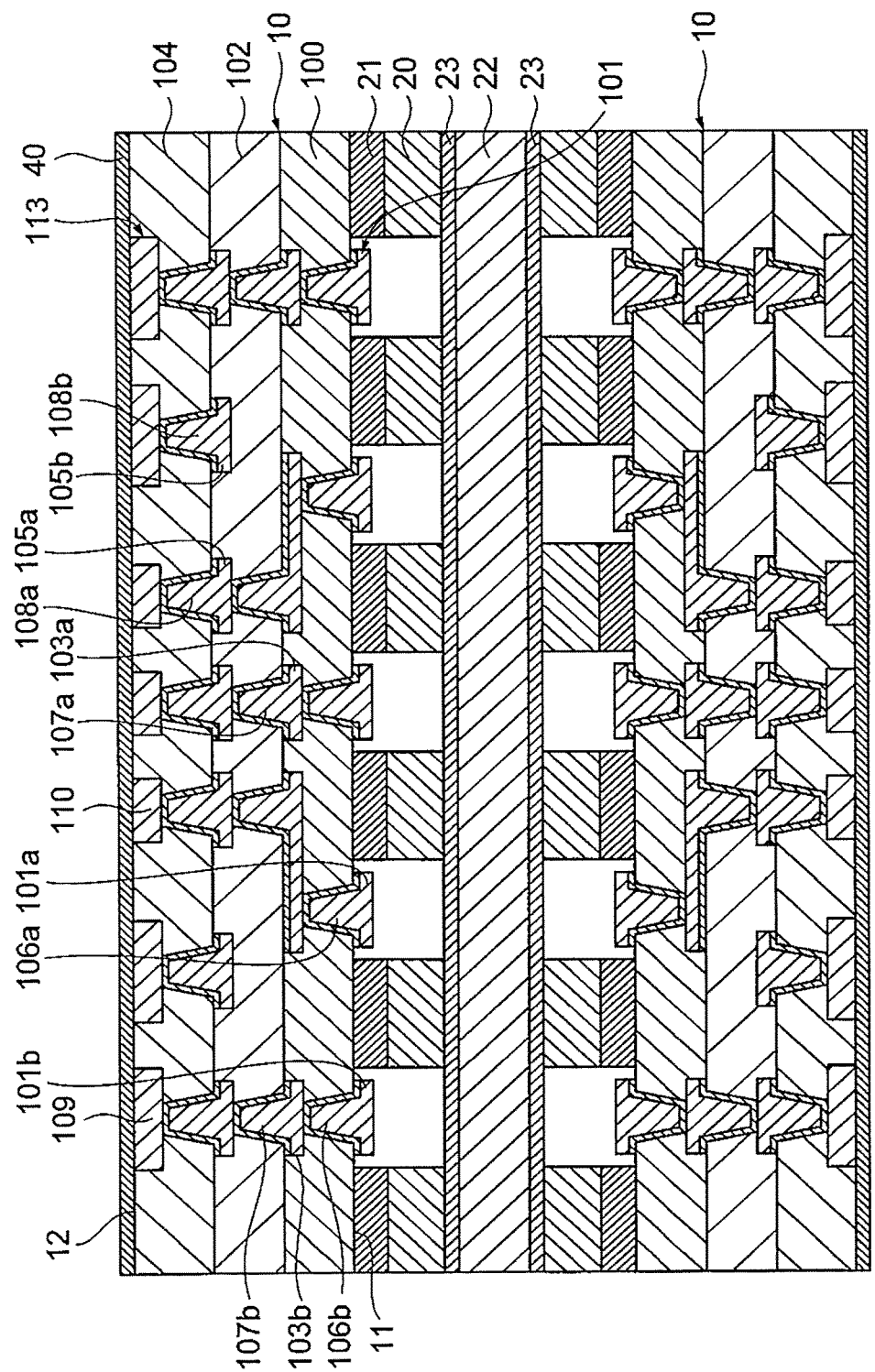
Figure 5B:
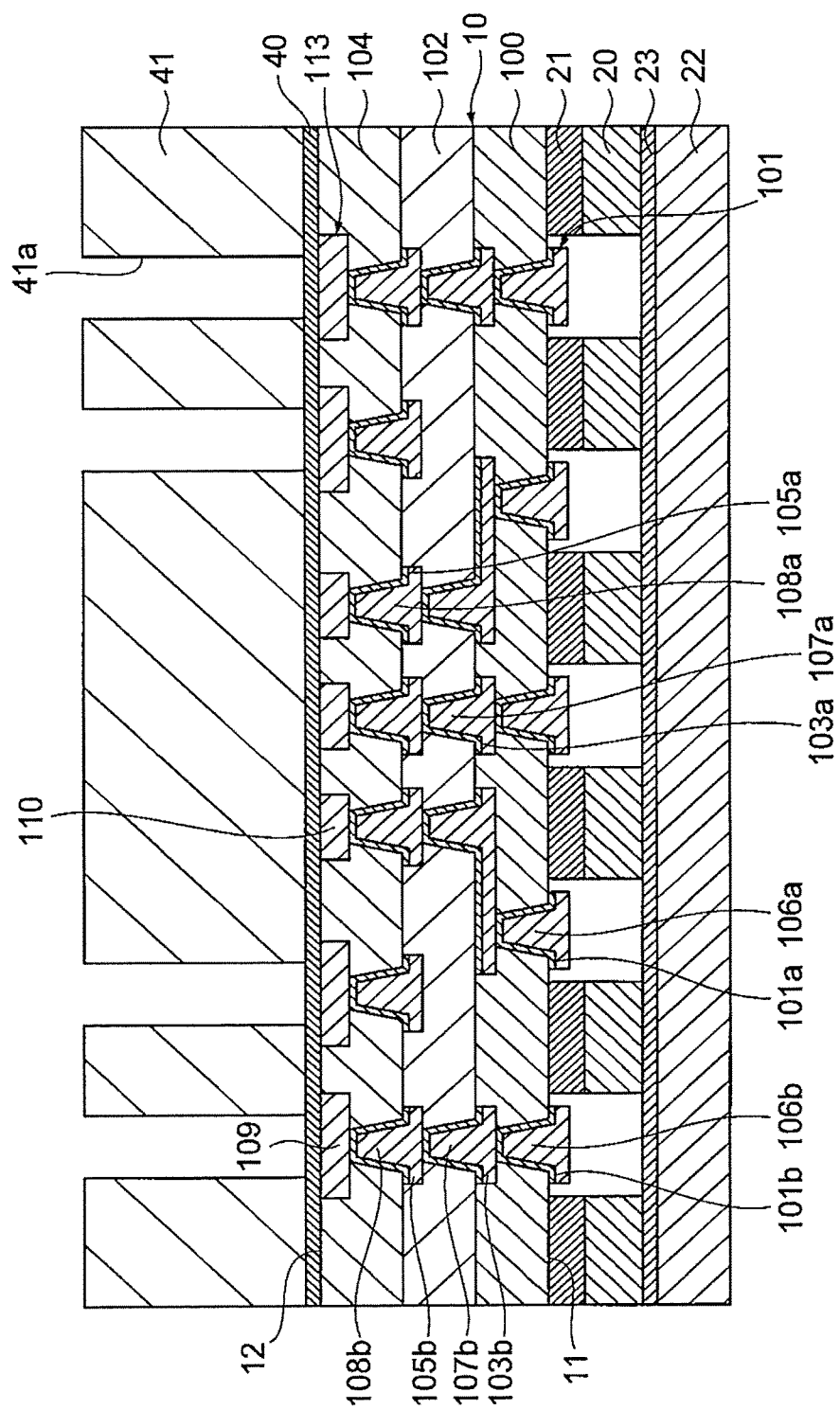
Figure 5E:
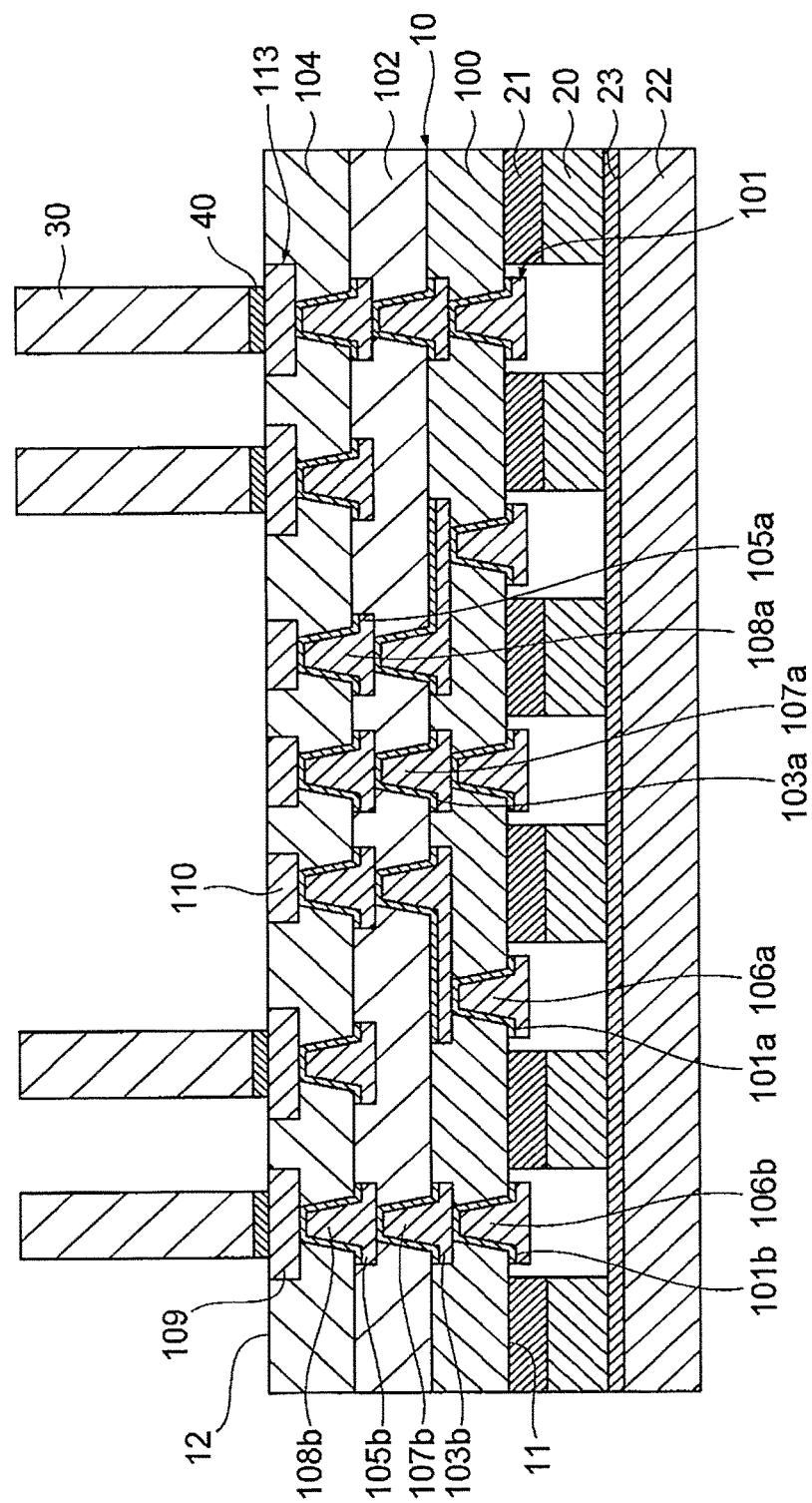
Figure 5F:
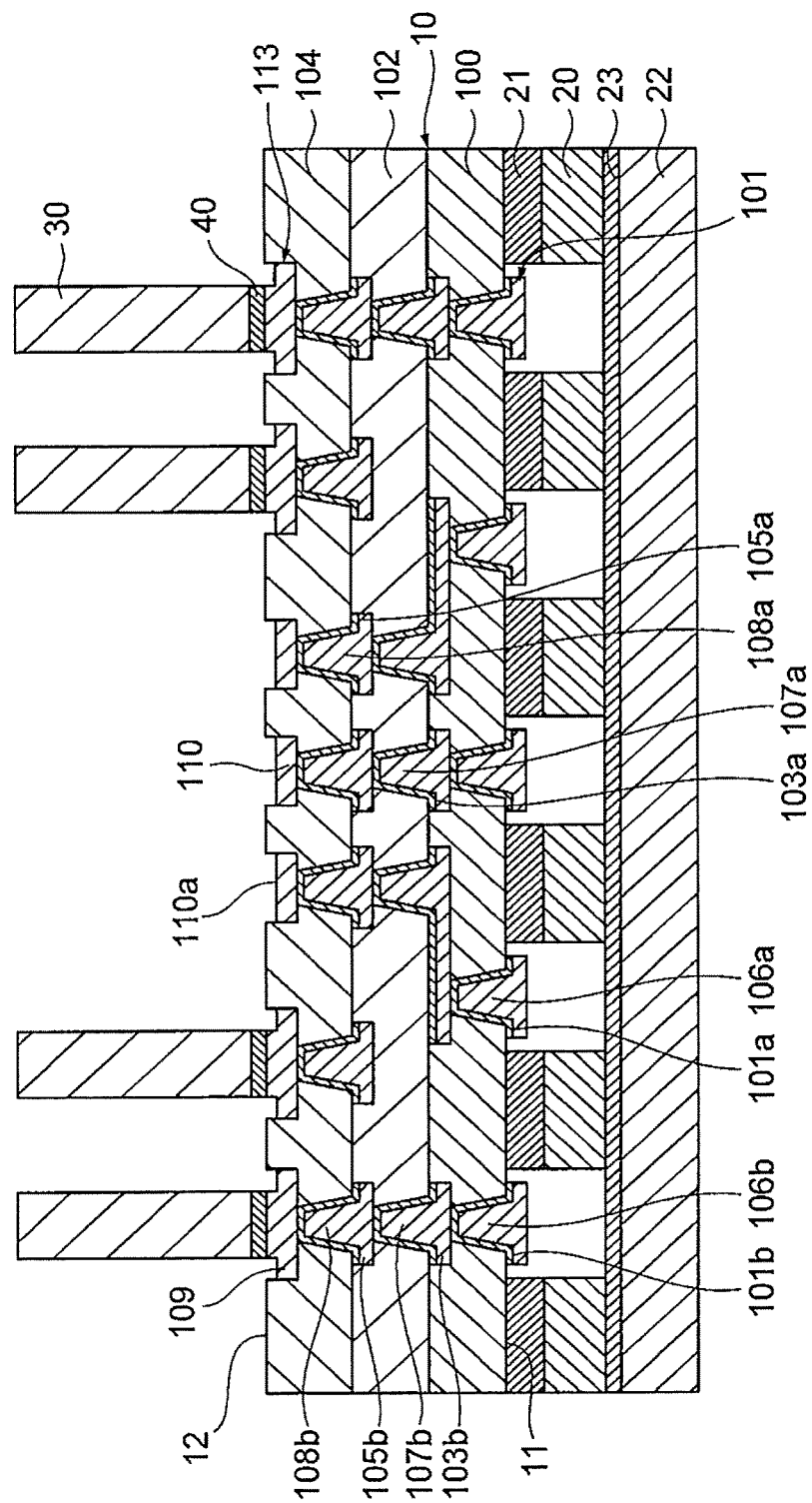
Figure 5G:
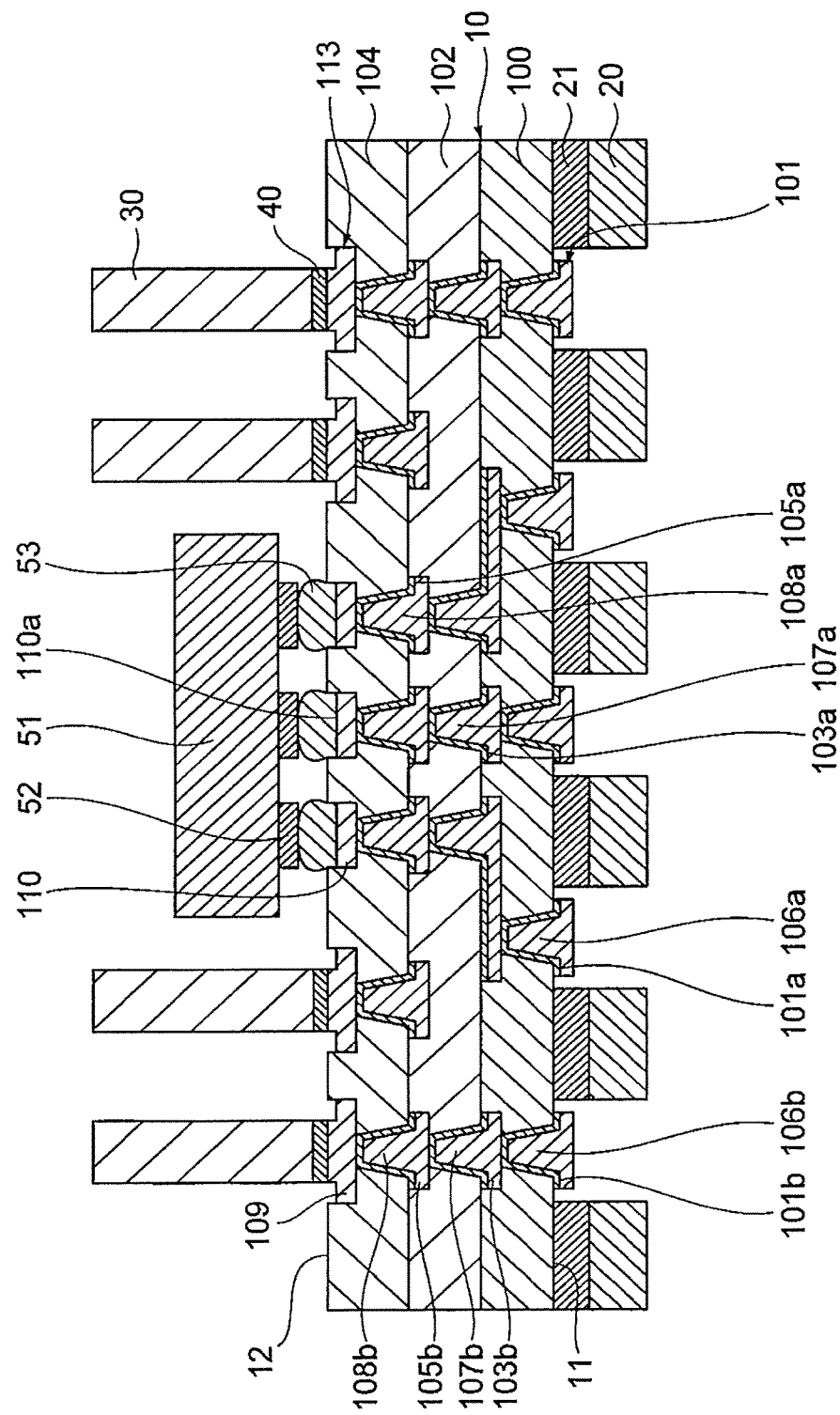
FIG. 5G is a schematic cross-sectional view for describing mounting an electronic component on the printed wiring board.

By a continuing etching process of the ninth process, the upper surfaces (110a) of the second conductor pads 110 and portions of the upper surfaces third conductor pads 109 exposed to the outside are recessed from the second main surface 12 (FIG. 5F). In this case, the etching process is controlled such that the recess amount (D) of the upper surfaces (110a) of the second conductor pads 110 relative to the second main surface 12 satisfies 0<D<10 μm. Subsequently, by removing the bonding layer 23, the third base plate 22 is removed. Thus, the printed wiring board 1 is manufactured.

As described above, inspection of conduction between the conductor posts 30 and the first conductor pads (101b) and inspection of conduction between the second conductor pads 110 and the first conductor pads (101a) are respectively performed. Subsequently, for the printed wiring board 1 that has passed the conduction inspection, by electrically connecting terminals 52 of an electronic component 51 to the second conductor pads 110 via solder bumps 53, the electronic component 51 is mounted on the second conductor pads 110 (see FIG. 5G). Next, the mounted electronic component 51 and the conductor posts 30 are sealed using a sealing resin layer 54. Specifically, a mold resin is applied to the second main surface 12 of the multilayer body 10 and a sealing resin layer 54 is formed such that the electronic component 51, the solder bumps 53, the copper foil 40, the conductor posts 30 and the like are covered (see FIG. 5H).

When the sealing resin layer 54 is formed, it is possible that the sealing resin layer 54 is formed such that an upper surface (54a) of the sealing resin layer 54 is on the same plane as the top surfaces (30a) of the conductor posts 30. Or, it is also possible that the sealing resin layer 54 is formed such that the top surfaces (30a) of the conductor posts 30 are covered and thereafter, the sealing resin layer 54 and the conductor posts 30 are polished until the upper surface (54a) of the sealing resin layer 54 and the top surfaces (30a) of the conductor posts 30 are on the same plane.

By removing the bonding layer 21, the second base plate 20 is removed.

In the above-described manufacturing method, in accordance with the manufacturing stages, the first base plate 60, the second base plate 20 and the third base plate 22 that each have certain strength are used. Therefore, occurrence of warpage due to a difference between thermal expansion coefficients of materials or the like can be suppressed. Further, the openings (20a, 20b) for exposing the first conductor pads (101a, 101b) are formed in the second base plate 20. Therefore, occurrence of warpage of the printed wiring board 1 can be prevented and influence on the conduction inspection due to the affixing of the second base plate 20 can be reduced. Further, the mounting of the electronic component 51 and the formation of the sealing resin layer 54 are performed in the state in which the base plate 20 is affixed to the first main surface 11 of the multilayer body 10. Therefore, occurrence of warpage can be suppressed and an effect of improving mountability can also be expected.

Second Embodiment

Figure 6:
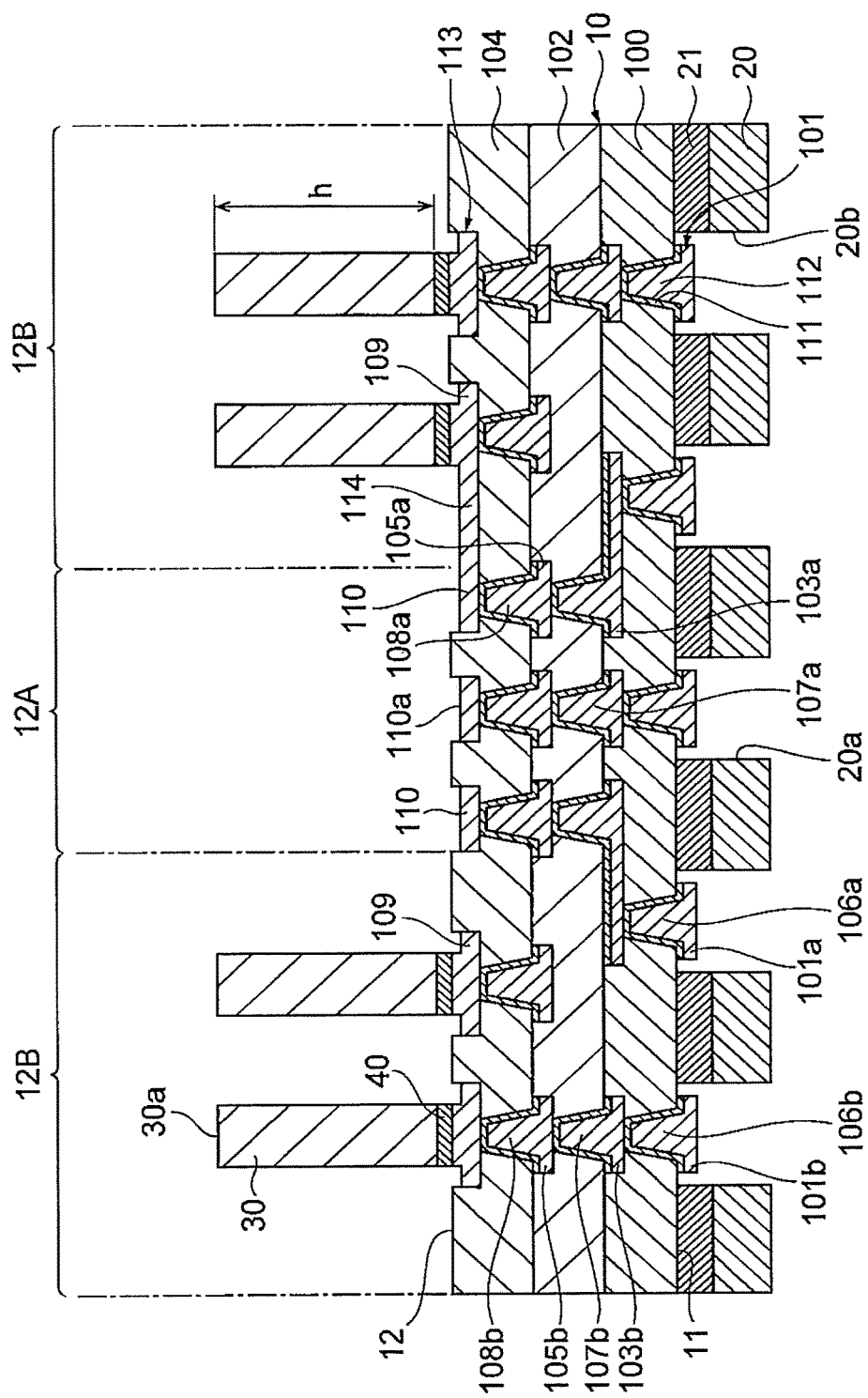
FIG. 6 is a schematic cross-sectional view illustrating a printed wiring board according to a second embodiment.

FIG. 6 is a schematic cross-sectional view illustrating a printed wiring board according to a second embodiment. The printed wiring board 2 according to the present embodiment is different from that of the first embodiment in that some of the second conductor pads 110 and some of the third conductor pads 109 are electrically connected to each other.

As illustrated in FIG. 6, among the multiple second conductor pads 110 and the multiple third conductor pads 109 that are formed on the second main surface 12 side, a second conductor pad 110 and a third conductor pad 109 that are adjacent to each other on the right-hand side are electrically connected to each other by a wiring layer 114, which is a part of the wiring layer 113 formed between the second conductor pad 110 and the third conductor pad 109. In the printed wiring board 2 according to the present embodiment, since some of the second conductor pads 110 and some of the third conductor pads 109 are electrically connected to each other, in addition to the same effect as that of the first embodiment, an effect of suppressing signal delay and reducing noise is further obtained.

Third Embodiment

Figure 7:
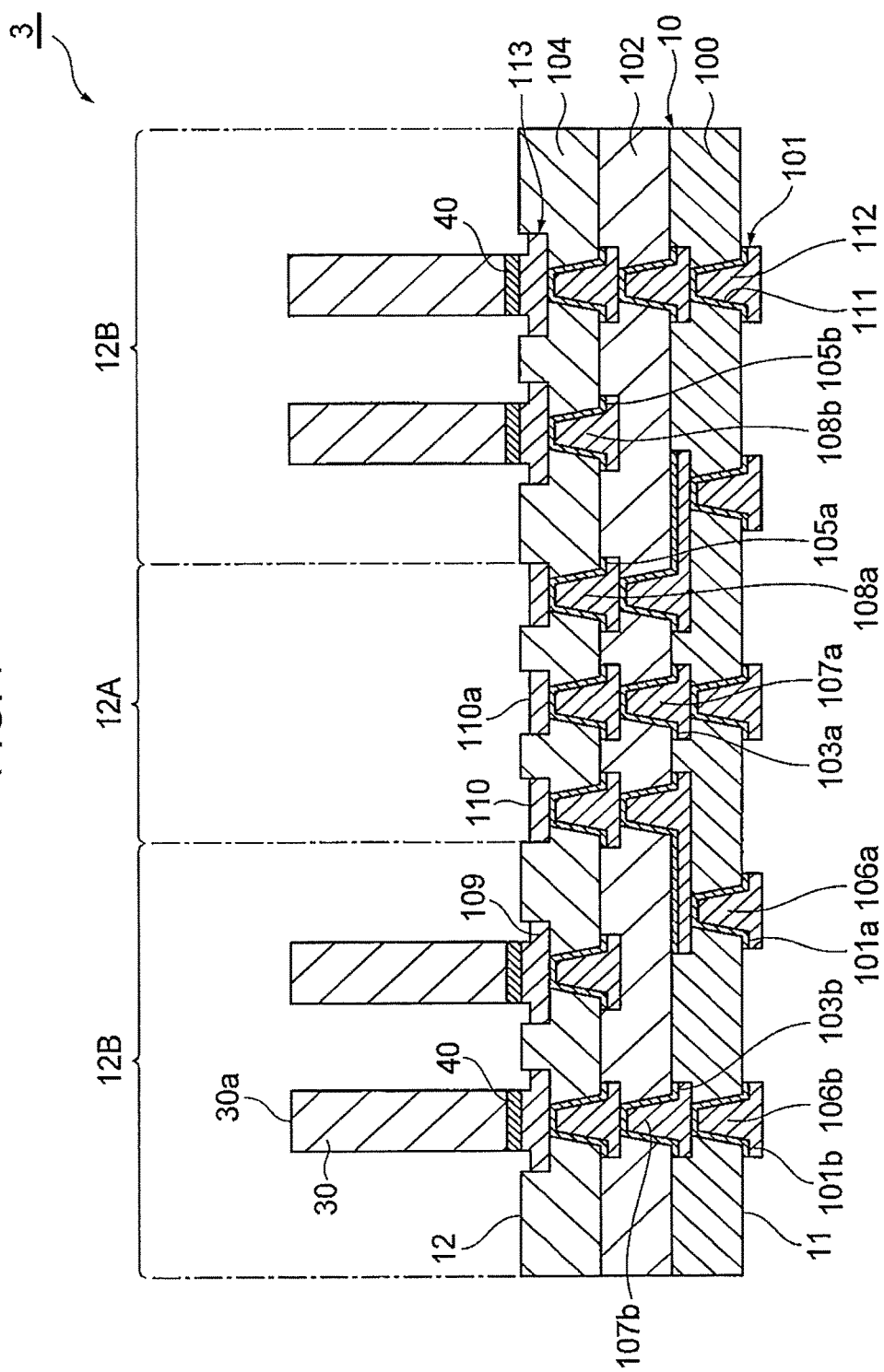
FIG. 7 is a schematic cross-sectional view illustrating a printed wiring board according to a third embodiment.

FIG. 7 is a schematic cross-sectional view illustrating a printed wiring board according to a third embodiment. The printed wiring board 3 according to the present embodiment is different from the first embodiment in that the base plate 20 is not provided. The printed wiring board 3 according to the present embodiment, for example, is manufactured by removing the bonding layer 21 and the base plate 20 after the printed wiring board 1 is manufactured as illustrated in the above-described tenth process without performing the mounting of the electronic component 51 and the formation of the sealing resin layer 54.

Fourth Embodiment

Figure 8:
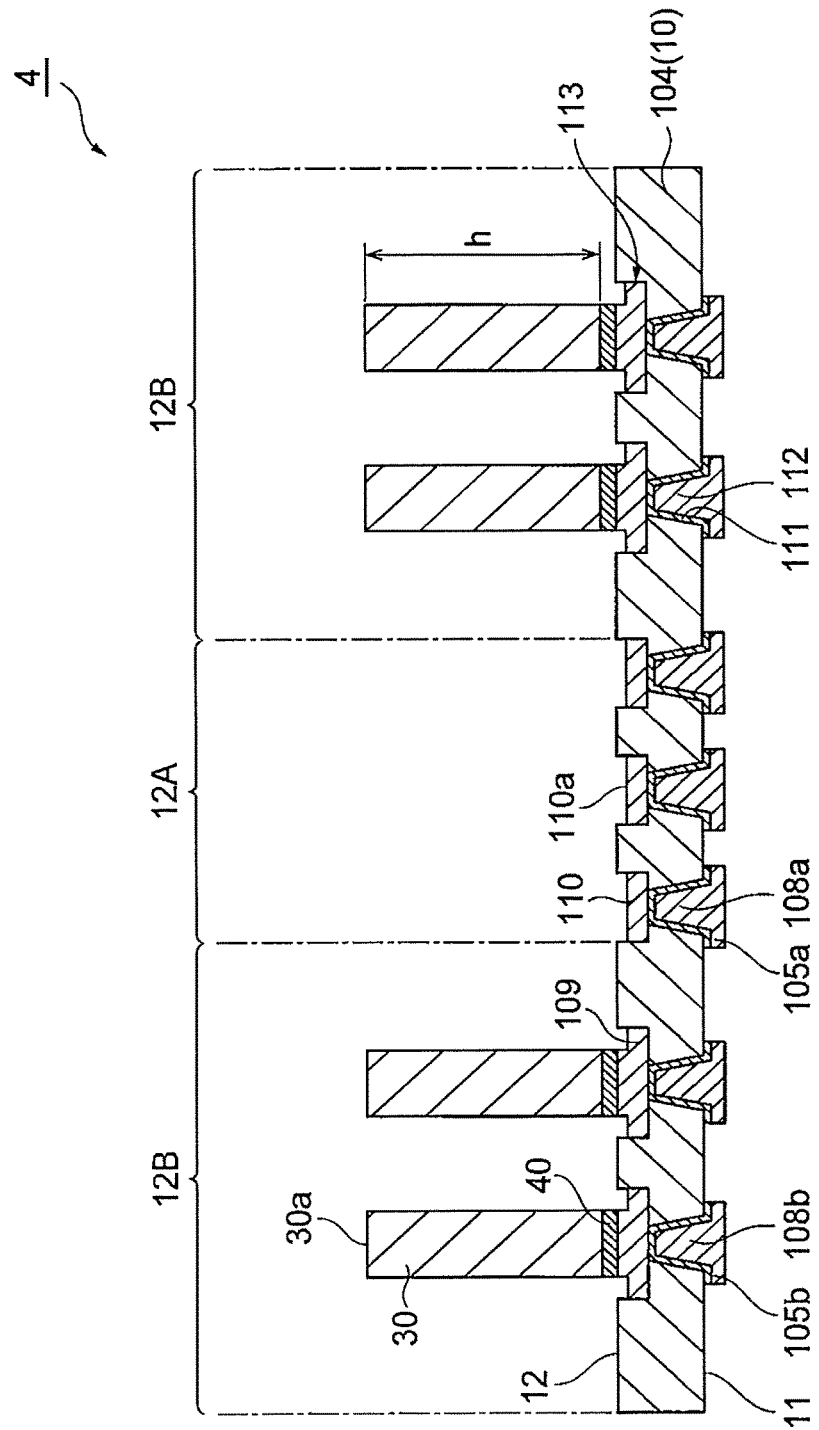
FIG. 8 is a schematic cross-sectional view illustrating a printed wiring board according to a fourth embodiment.

FIG. 8 is a schematic cross-sectional view illustrating a printed wiring board according to a fourth embodiment. The printed wiring board 4 according to the present embodiment is different from the third embodiment in that the multilayer body 10 includes only one insulating layer, which is the insulating layer 104. In this case, a lower surface of the insulating layer 104 forms the first main surface 11 of the multilayer body 10, and the upper surface of the insulating layer 104 forms the second main surface 12 of the multilayer body 10. The wiring layers (105a, 105b) correspond to "first conductor pads."

In the following, with reference to FIGS. 9 and 10, a semiconductor package of a POP structure, in which the printed wiring board 3 of the third embodiment is used, is described.

Figure 9:
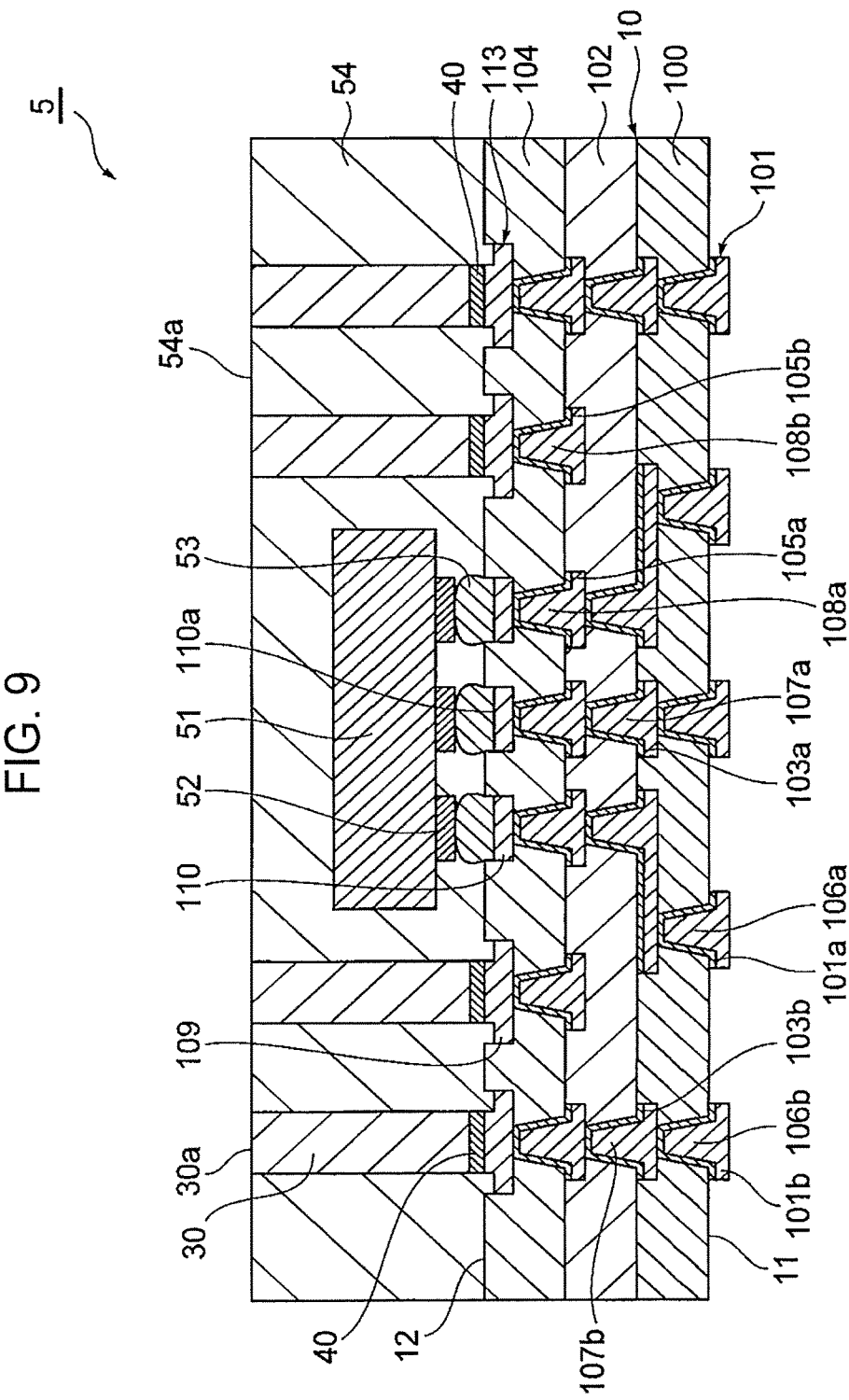
FIG. 9 is a schematic cross-sectional view illustrating a semiconductor package of a POP structure in which a printed wiring board is used.

In the example illustrated in FIG. 9, the electronic component 51 is mounted on the second main surface 12 side of the multilayer body 10. The terminals 52 of the electronic component 51 are electrically connected to the second conductor pads 110 via the solder bumps 53. Further, the sealing resin layer 54 is provided on the second main surface 12 of the multilayer body 10. The electronic component 51, the solder bumps 53 and the copper foil 40 are sealed by the sealing resin layer 54. On the other hand, the conductor posts 30, except the top surfaces (30a), are sealed by the sealing resin layer 54. The top surfaces (30a) are positioned on the plane as the upper surface (54a) of the sealing resin layer 54, and are exposed to the outside.

In the semiconductor package 5 that is structured as described above, the conductor posts 30, the electronic component 51 and the like are protected by the sealing resin layer 54 and thus are protected from vibration, impact and the like. Further, the top surfaces (30a) of the conductor posts 30 are positioned on the same plane as the upper surface (54a) of the sealing resin layer 54 and are exposed to the outside. Therefore, the conductor posts 30 can be easily connected to another wiring board. The semiconductor package 5, for example, is manufactured by using the above-described method illustrated in FIGS. 5G and 5H and then by removing the second base plate 20.

Figure 10:
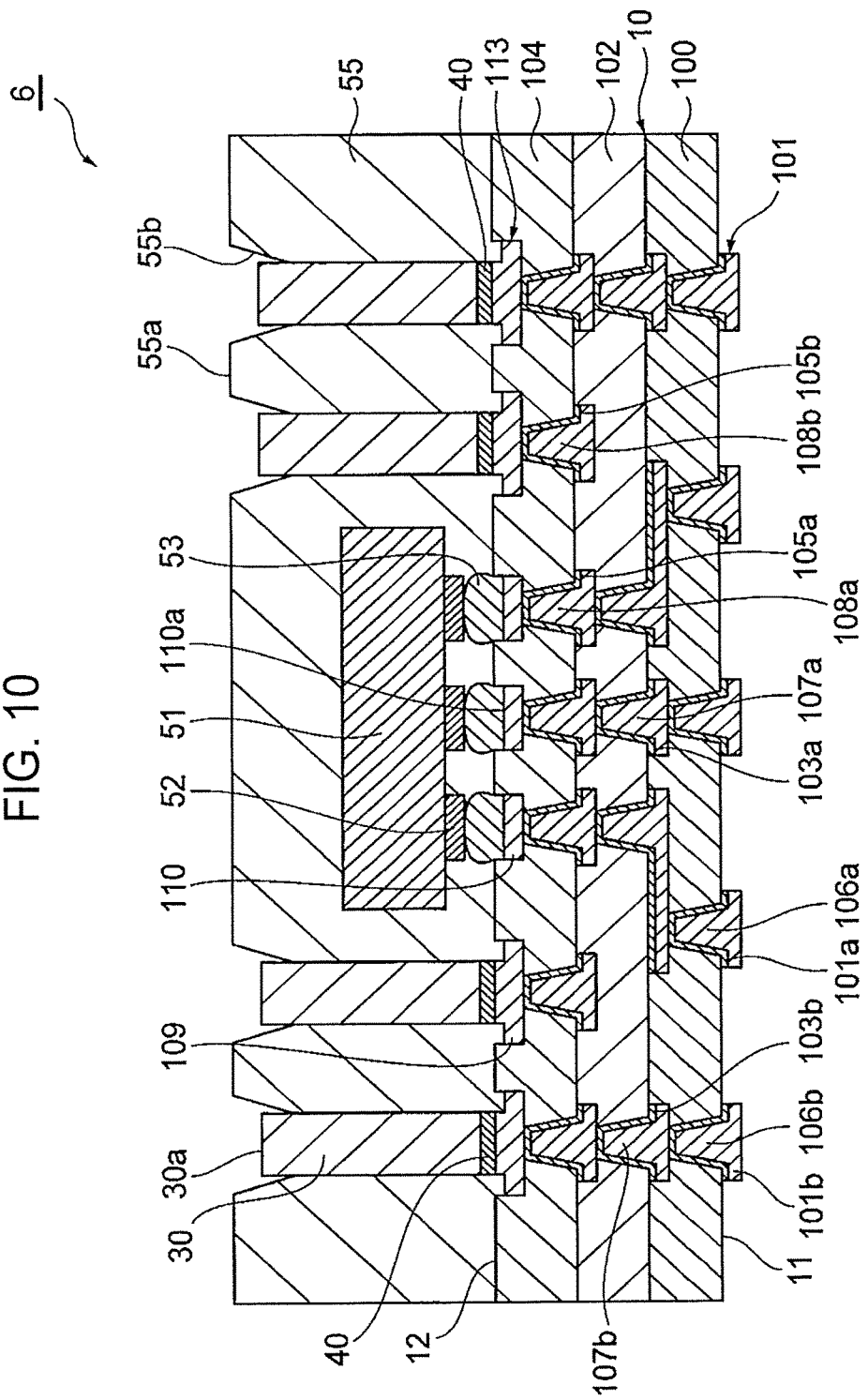
FIG. 10 is a schematic cross-sectional view illustrating a semiconductor package of a POP structure in which a printed wiring board is used.

In the example illustrated in FIG. 10, the electronic component 51 is mounted on the second main surface 12 of the multilayer body 10. The electronic component 51, the solder bumps 53, the copper foil 40 and the conductor posts 30 are sealed by a sealing resin layer 55. Openings (55b) that each expose a top surface (30a) and a portion of a side surface of a conductor post 30 are formed in the sealing resin layer 55.

In the semiconductor package 6 that is structured as described above, the conductor posts 30 and the electronic component 51 that is mounted on the second conductor pads are sealed by the sealing resin layer 55. Therefore, the conductor posts 30 and the electronic component 51 are protected by the sealing resin layer 55 and thus are protected from external impact and the like. Further, the top surfaces (30a) of the conductor posts 30 are also exposed to the outside. Therefore, while being protected by the sealing resin layer 55, the conductor posts 30 can be easily connected to another wiring board.

The semiconductor package 6, for example, is manufactured using the following method. That is, first, the electronic component 51 is mounted to the second conductor pads 110 via the solder bumps 53. Next, after the electronic component 51, the conductor posts 30 and the like are sealed by the sealing resin layer 55, the openings (55b) are formed by laser processing such that a front end and a portion of a side surface of each of the conductor posts 30 are exposed to the outside. Finally, the second base plate 20 is removed.

In the above, embodiments of the present invention are described in detail. However, the present invention is not limited to the above-described embodiments. Various modifications are possible within the scope without departing from the spirit of the present invention. For example, in the above-described method for manufacturing the printed wiring board 1, the second base plate 20 is affixed to the multilayer body 10 after the openings (20a, 20b) that expose the first conductor pads (101a, 101b) are formed in the bonding layer 21 and the second base plate 20. However, it is also possible that the second base plate is affixed to the multilayer body 10 without forming the openings, and the openings are formed by laser processing before the conduction inspection.

When heated in a reflow oven or the like, solder balls are likely to melt and flow to surrounding areas. Further, since a load of a mounted upper substrate may act on the solder balls, the solder balls are likely to laterally expand. Therefore, an electrical short circuit is likely to occur between adjacent solder balls. To prevent occurrence of such an electrical short circuit, it has been considered to increase, to some extent, distances between mounting pads on which the solder balls are placed. However, when the distances between the mounting pads are increased, there is a new problem that it is difficult to form wirings at a fine pitch.

A printed wiring board according to an embodiment of the present invention includes: a multilayer body that has a first main surface and a second main surface that is on an opposite side of the first main surface; a first wiring layer that is formed on the first main surface of the multilayer body and includes multiple first conductor pads; a second wiring layer that is formed on the second main surface side of the multilayer body and includes multiple second conductor pads for connecting to an electronic component and multiple third conductor pads for connecting to another wiring board; multiple via conductors that are formed in the multilayer body and are each gradually reduced in diameter from the first main surface toward the second main surface; a metal foil that is formed on the third conductor pads; and conductor posts that are formed on the metal foil and are each formed of a plating layer. The second conductor pads are positioned in a central portion of the second main surface and are embedded in the multilayer body. The third conductor pads are positioned in an outer edge portion of the second main surface and are embedded in the multilayer body. An upper surface of each of the second conductor pads is exposed to outside and is recessed from the second main surface.

Further, a method for manufacturing a printed wiring board according to an embodiment of the present invention includes: a process in which a metal foil with a carrier copper foil is affixed to a first base plate; a process in which a second wiring layer that includes multiple second conductor pads for connecting to an electronic component and multiple third conductor pads for connecting to another wiring board is formed such that the second conductor pads are formed in a central portion of the metal foil and the third conductor pads are formed in an outer edge portion of the metal foil; a process in which a multilayer body that has a first main surface and a second main surface that is on an opposite side of the first main surface is formed on the second wiring layer and on the metal foil such that the second main surface faces the metal foil side; a process in which a first wiring layer that includes multiple first conductor pads is formed on the first main surface of the multilayer body; a process in which the metal foil is exposed by peeling off the first base plate and the carrier copper foil; a process in which a second base plate on which a bonding layer is formed is prepared, and openings are formed in advance in the second base plate and the bonding layer such that, in a state in which the second base plate is affixed to the first main surface of the multilayer body, the first conductor pads that are formed on the first main surface are exposed; a process in which the second base plate is affixed to the first main surface of the multilayer body via the bonding layer; a process in which conductor posts are formed on the metal foil at positions in contact with the third conductor pads; and a process in which the metal foil except portions in contact with the conductor posts is removed.

According to an embodiment of the present invention, formation of wirings at a fine pitch can be achieved while occurrence of an electrical short circuit can be prevented, and occurrence of warpage can be suppressed.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
   a multilayer body;
   a first wiring layer formed on a first surface of the multilayer body and comprising a plurality of first conductor pads;
   a second wiring layer embedded into a second surface of the multilayer body on an opposite side with respect to the first surface and comprising a plurality of second conductor pads and a plurality of third conductor pads;
   a plurality of conductor posts each comprising a plating material and formed on the third conductor pads, respectively; and
   a plurality of via conductors formed in the multilayer body such that each of the via conductors has a diameter gradually reducing from the first surface toward the second surface of the multilayer body,
   wherein each of the third conductor pads has a surface having a step such that a peripheral edge portion of the surface is recessed from the second surface of the multilayer body, and a metal foil formed thereon such that each of the conductor posts is formed on the metal foil, the second wiring layer is formed such that the plurality of second conductor pads is positioned to connect an electronic component and formed in a central portion of the second surface of the multilayer body and that the plurality of third conductor pads is positioned to connect another wiring board and formed in an outer edge portion of the second surface of the multilayer body, and the plurality of second conductor pads is formed such that each of the second conductor pads has an exposed upper surface recessed from the second surface.

2. A printed wiring board according to claim 1, wherein the second wiring layer is formed such that the second conductor pads and third conductor pads include a plurality of the second conductor pads and a plurality of the third conductor pads connected each other.

3. A printed wiring board according to claim 2, further comprising:
a base plate positioned on the first surface of the multilayer body; and
a bonding layer fixing the base plate to the first surface of the multilayer body,
wherein the base plate and the bonding layer have a plurality of opening portions exposing the plurality of first conductor pads, respectively.

4. A printed wiring board according to claim 2, wherein the second wiring layer is formed such that the exposed upper surface of each of the second conductor pads has an recess amount D satisfying 0<D<10 μm.

5. A printed wiring board according to claim 2, wherein the second wiring layer is formed such that the plurality of second conductor pads has a pitch between adjacent second conductor pads which is smaller than a pitch between adjacent third conductor pads, and that the pitch of the third conductor pads is equal to a pitch between adjacent conductor posts.

6. A printed wiring board according to claim 2, wherein the plurality of conductor posts is formed such that each of the conductor posts has a height h satisfying 50 μm<h<200 μm.

7. A printed wiring board according to claim 2, wherein the plurality of conductor posts is formed such that each of the conductor posts has a diameter which is smaller than a diameter of each of the third conductor pads.

8. A printed wiring board according to claim 2, wherein the multilayer body comprises an insulating layer consisting of a single insulating layer.

9. A printed wiring board according to claim 1, further comprising:
a base plate positioned on the first surface of the multilayer body; and
a bonding layer fixing the base plate to the first surface of the multilayer body,
wherein the base plate and the bonding layer have a plurality of opening portions exposing the plurality of first conductor pads, respectively.

10. A printed wiring board according to claim 9, wherein the second wiring layer is formed such that the exposed upper surface of each of the second conductor pads has an recess amount D satisfying 0<D<10 μm.

11. A printed wiring board according to claim 9, wherein the second wiring layer is formed such that the plurality of second conductor pads has a pitch between adjacent second conductor pads which is smaller than a pitch between adjacent third conductor pads, and that the pitch of the third conductor pads is equal to a pitch between adjacent conductor posts.

12. A printed wiring board according to claim 9, wherein the second wiring layer is formed such that the plurality of second conductor pads has a pitch between adjacent second conductor pads which is smaller than a pitch between adjacent third conductor pads, and that the pitch of the third conductor pads is equal to a pitch between adjacent conductor posts.

13. A printed wiring board according to claim 12, wherein the second wiring layer is formed such that the exposed upper surface of each of the second conductor pads has an recess amount D satisfying 0<D<10 μm.

14. A printed wiring board according to claim 1, wherein the second wiring layer is formed such that the plurality of second conductor pads has a pitch between adjacent second conductor pads which is smaller than a pitch between adjacent third conductor pads, and that the pitch of the third conductor pads is equal to a pitch between adjacent conductor posts.

15. A printed wiring board according to claim 1, wherein the plurality of conductor posts is formed such that each of the conductor posts has a height h satisfying 50 μm<h<200 μm.

16. A printed wiring board according to claim 1, wherein the plurality of conductor posts is formed such that each of the conductor posts has a diameter which is smaller than a diameter of each of the third conductor pads.

17. A printed wiring board according to claim 1, wherein the multilayer body comprises an insulating layer consisting of a single insulating layer.

18. A method for manufacturing a printed wiring board, comprising:
fixing a metal foil having a carrier copper foil to a first base plate;
forming a second wiring layer comprising a plurality of second conductor pads and a plurality of third conductor pads;
forming a multilayer body on the second wiring layer and on the metal foil such that the multilayer body has a first surface and a second surface facing the metal foil on an opposite side with respect to the first surface;
forming a first wiring layer comprising a plurality of first conductor pads on the first surface of the multilayer body;
removing the first base plate and the carrier copper foil from the metal foil such that the metal foil is exposed;
fixing, to the first surface of the multilayer body, a second base plate having a bonding layer and a plurality of opening portions such that the bonding layer attaches the second base plate to the first surface of the multilayer body and the plurality of opening portions exposes the plurality of first conductor pads, respectively;
forming a plurality of conductor posts on the metal foil such that the plurality of conductor posts is positioned on the plurality of third conductor pads, respectively;
removing part of the metal foil not in contact with the conductor posts; and
etching the plurality of second conductor pads and the plurality of third conductor pads such that each of the second conductor pads has an exposed upper surface recessed from the second surface of the multilayer body and that each of the third conductor pads has a surface having a step and a peripheral edge portion recessed from the second surface of the multilayer body,
wherein the second wiring layer is formed such that the plurality of second conductor pads is positioned to connect an electronic component and formed in a central portion of the metal foil and that the plurality of third conductor pads is positioned to connect another wiring board and formed in an outer edge portion of the metal foil.

19. A method for manufacturing a printed wiring board according to claim 17, further comprising:
connecting the electronic component to the plurality of second conductor pads such that the electronic component is mounted to the second surface of the multilayer body; and forming a sealing resin layer on the second surface of the multilayer body such that the electronic component and the plurality of conductor posts are sealed in the sealing resin layer.

20. A method for manufacturing a printed wiring board according to claim 17, further comprising:

removing the second base plate from the first surface of the multilayer body.

* * * * *